(12) United States Patent
Gomes et al.

(10) Patent No.: US 11,056,492 B1
(45) Date of Patent: Jul. 6, 2021

(54) DENSE MEMORY ARRAYS UTILIZING ACCESS TRANSISTORS WITH BACK-SIDE CONTACTS

(71) Applicant: Intel Corporation, Santa Clara, CA (US)

(72) Inventors: Wilfred Gomes, Portland, OR (US);
Mauro J. Kobrinsky, Portland, OR (US); Elliot Tan, Portland, OR (US);
Szuya S. Liao, Portland, OR (US);
Tahir Ghani, Portland, OR (US);
Swaminathan Sivakumar, Beaverton, OR (US); Rajesh Kumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/724,691

(22) Filed: Dec. 23, 2019

(51) Int. Cl.
*G11C 11/34* (2006.01)
*H01L 27/108* (2006.01)
(Continued)

(52) U.S. Cl.
CPC .......... *H01L 27/10826* (2013.01); *G11C 5/04* (2013.01); *G11C 5/10* (2013.01); *G11C 11/4023* (2013.01); *H01L 27/1085* (2013.01)

(58) Field of Classification Search
CPC . G11C 11/22; G11C 11/2273; G11C 11/2275; G11C 11/221; G11C 11/5657;
(Continued)

(56) References Cited

U.S. PATENT DOCUMENTS 7,092,288 B2 * 8/2006 Lojek .................. G11C 16/102
 365/185.01
7,701,751 B2 * 4/2010 Kang .................. G11C 11/4097
 365/149

(Continued)

FOREIGN PATENT DOCUMENTS

EP 3534401 A2 9/2019
WO 2018208719 A1 11/2018

OTHER PUBLICATIONS

Hsieh, E.R., et al., "A Novel Architecture to Build Ideal-linearity Neuromorphic Synapses on a Pure Logic FinFET Platform Featuring 2.5ns PGM-time and 1012 Endurance," 2019 Symposium on VLSI Technology Digest of Technical Papers; 2 pages.

(Continued)

*Primary Examiner* — Hien N Nguyen
(74) *Attorney, Agent, or Firm* — Patent Capital Group

(57) ABSTRACT

Described herein are memory arrays where some memory cells include access transistors with one front-side and one back-side source/drain (S/D) contacts. An example memory array further includes a bitline, coupled to the first S/D region of the access transistor of a first memory cell of the memory array, and a plateline, coupled to a first capacitor electrode of a storage capacitor of the first memory cell. Because the access transistor is a transistor with one front-side and one back-side S/D contacts, the bitline may be provided in a first layer, the channel material—in a second layer, and the plateline—in a third layer, where the second layer is between the first layer and the third layer, which may allow increasing the density of memory cells in a memory array, or, conversely, reducing the footprint area of a memory array with a given density of memory cells.

18 Claims, 12 Drawing Sheets

(51) Int. Cl.
*G11C 5/04* (2006.01)
*G11C 5/10* (2006.01)
*G11C 11/402* (2006.01)

(58) Field of Classification Search
CPC ......... G11C 7/18; G11C 8/08; G11C 11/2255; G11C 11/2257; G11C 8/10; G11C 8/16; G11C 11/1659; G11C 11/02
See application file for complete search history.

(56) References Cited

U.S. PATENT DOCUMENTS

| | | | |
|---|---|---|---|
| 7,804,702 B2 * | 9/2010 | Madan | H01L 27/11502 365/145 |
| 8,178,862 B2 | 5/2012 | Colinge | |
| 2002/0036313 A1 | 3/2002 | Yang et al. | |
| 2010/0295102 A1 | 11/2010 | Sankin et al. | |
| 2015/0035568 A1 | 2/2015 | Peng et al. | |
| 2015/0162336 A1 | 6/2015 | Kim et al. | |
| 2016/0197069 A1 | 7/2016 | Morrow et al. | |
| 2017/0287905 A1 | 10/2017 | Morrow et al. | |
| 2018/0323199 A1 | 11/2018 | Roberts et al. | |
| 2019/0103406 A1 | 4/2019 | Tang et al. | |
| 2019/0287908 A1 | 9/2019 | Dogiamis et al. | |
| 2019/0305135 A1 | 10/2019 | Radosavljevic et al. | |
| 2020/0127142 A1 | 4/2020 | Dewey et al. | |

OTHER PUBLICATIONS

Khasanvis, S., et al., "Low-Power Heterogeneous Graphene Nanoribbon-CMOS Multistate Volatile Memory Circuit," 17 pages.

Trombini, H., et al., "Unraveling structural and compositional information in 3D FinFET electronic devices," Nature.com/Scientific Reports; 7 pages (Aug. 12, 2019).

Xu, C., et al., "Modeling, Analysis, and Design of Graphene Nano-Ribbon Interconnects," IEEE Transaction on Electron Devices; vol. 56, No. 8; pp. 1567-1578 (Aug. 2009).

Anil, D.G., et al., "Performance evaluation of ternary computation in SRAM design using graphene nanoribbon field effect transistors," 2018 IEEE 8th Annual Computing and Communication Workshop and Conference (CCWC), Las Vegas, NV, 2018, pp. 382, 388 (Year: 2018).

Joshi, S., et al., "Graphene Nanoribbon Field Effect Transistor Based Ultra-Low Energy SRAM Design," 2016 IEEE International Symposium on Nanoelectronic and Information Systems (iNIS), Gwalior, 2016, pp. 76-79.

Rableefar, et al., "Utilizing Graphene Nano-Ribbon Transistor in Data Converters: A Comparative Study," ECS Journal of Solid State Science and Technology, 8; M30-M37 (Year: 2019).

EP Extended European Search Report issued in EP Application No. 20191821.6 dated Feb. 2, 2021; 9 pages.

EPO Jan. 11, 2021—Partial European Search Report from European Application No. 20181563.6; 13 pages.

* cited by examiner

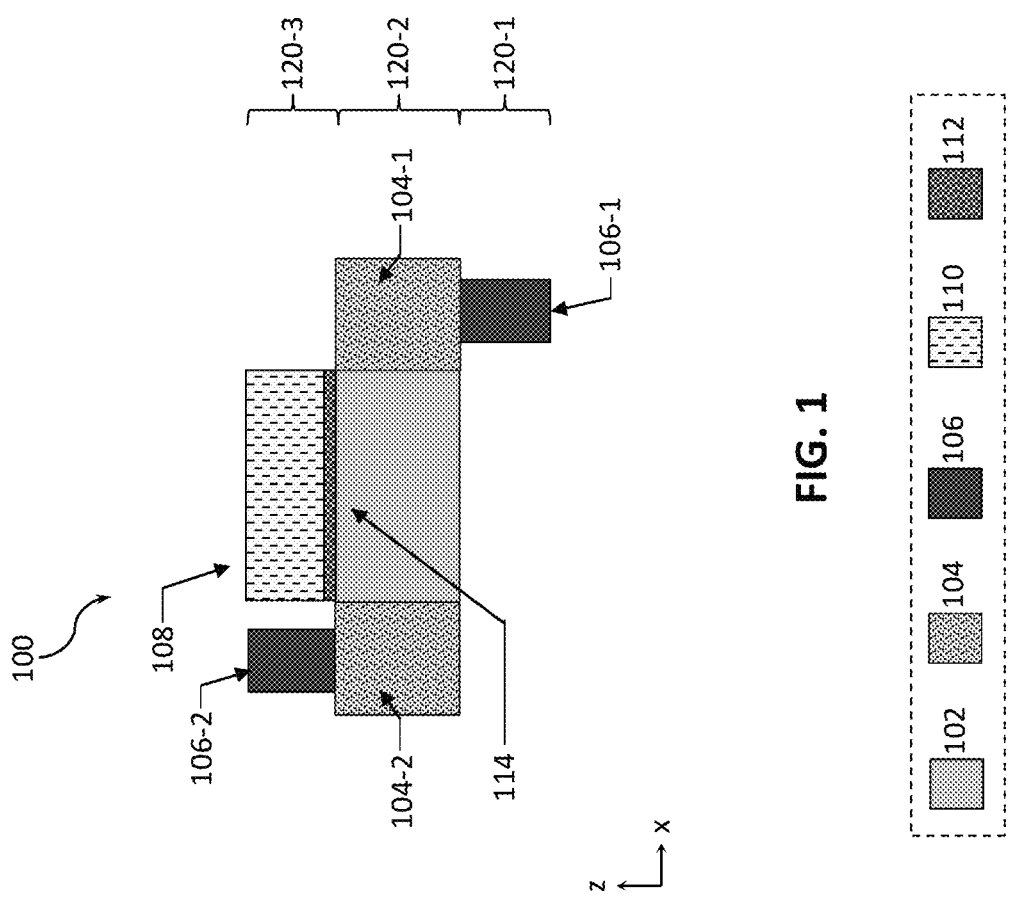

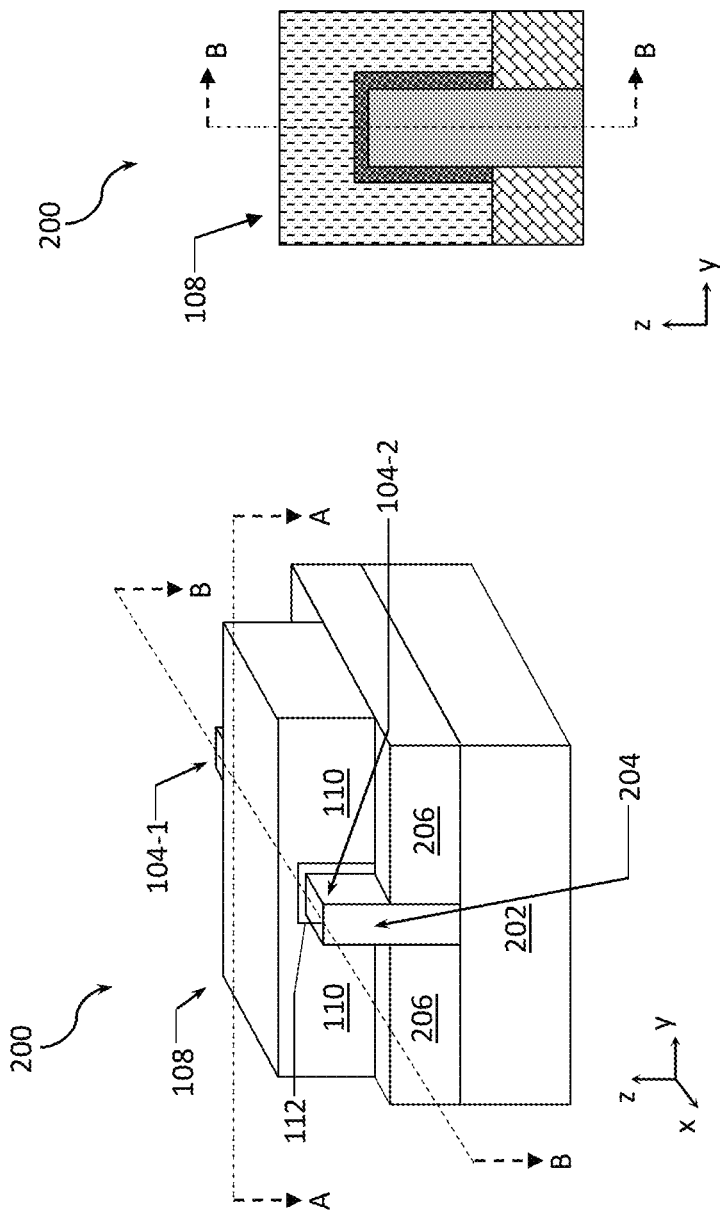
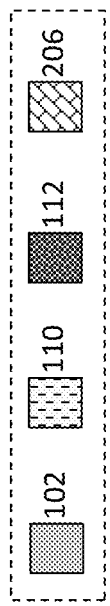
FIG. 2B
FIG. 2A

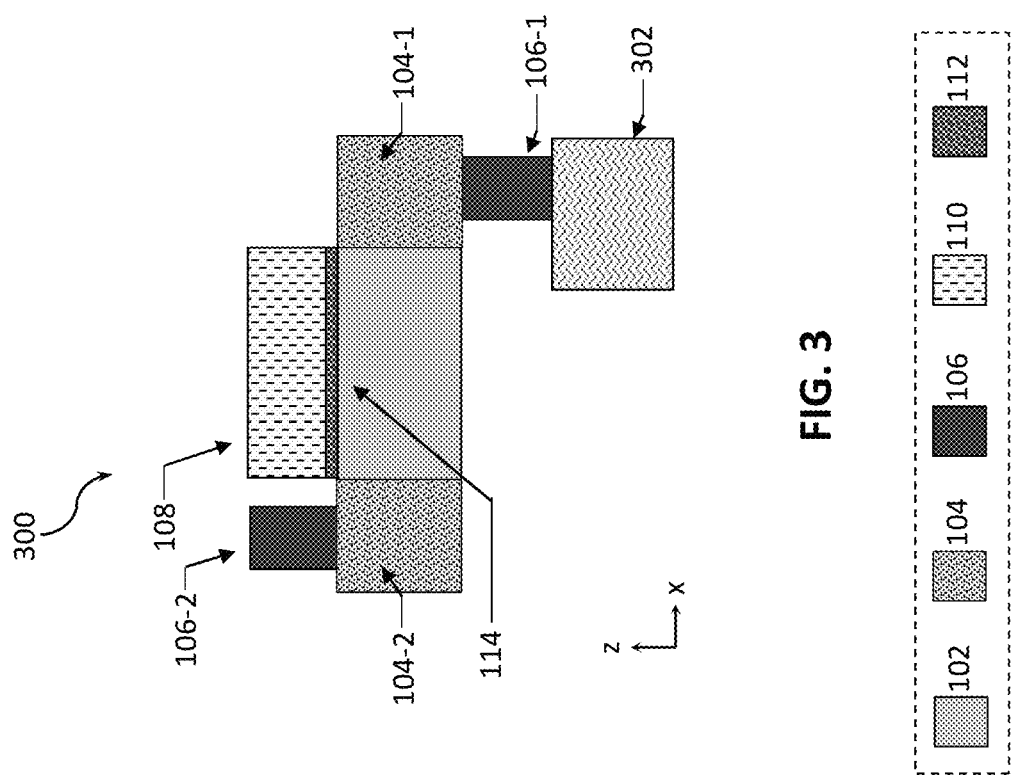

DENSE MEMORY ARRAYS UTILIZING ACCESS TRANSISTORS WITH BACK-SIDE CONTACTS

BACKGROUND

Embedded memory is important to the performance of modern system-on-a-chip (SoC) technology. Dense low power embedded memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 provides a schematic illustration of a cross-sectional view of an example access transistor with a back-side contact according to some embodiments of the present disclosure.

FIGS. 2A-2B are perspective and cross-sectional views, respectively, of an example access transistor with a back-side contact implemented as a FinFET, according to some embodiments of the present disclosure.

FIG. 3 provides a schematic illustration of a cross-sectional view of an example memory cell that includes an access transistor with a back-side contact, according to some embodiments of the present disclosure.

DETAILED DESCRIPTION

Overview

Figure 4:
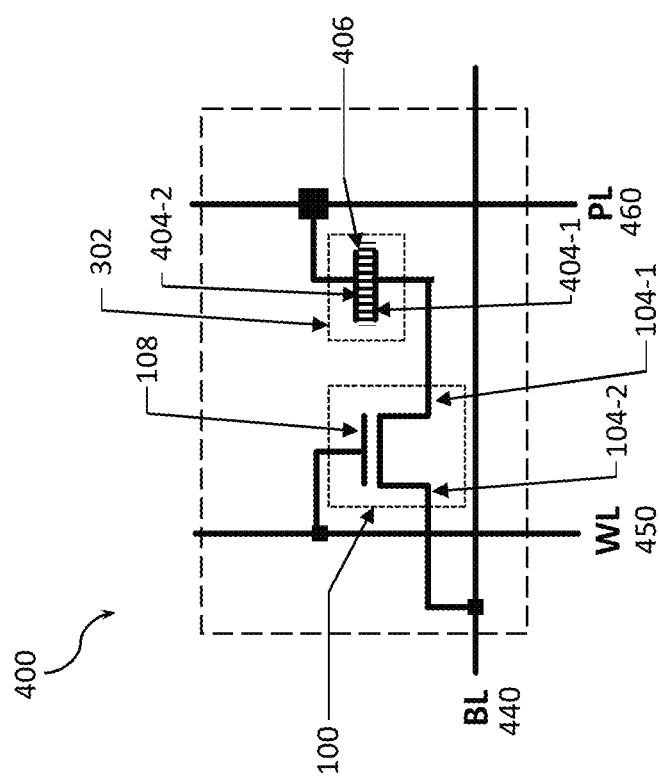
FIG. 4 is a schematic illustration of a one access transistor (1T) and one capacitor (1T-1C) memory cell, according to some embodiments of the present disclosure.

Some memory devices may be considered "standalone" devices in that they are included in a chip that does not also include compute logic (where, as used herein, the term "compute logic devices" or simply "compute logic" or "logic devices," refers to devices, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Some embodiments of the present disclosure may refer to dynamic random-access memory (DRAM) and in particular, embedded DRAM (eDRAM), because this type of memory has been introduced in the past to address the limitation in density and standby power of large SRAM-based caches. However, embodiments of the present disclosure are equally applicable to memory cells implemented other technologies. Thus, in general, memory cells described herein may be implemented as eDRAM cells, spin-transfer torque random access memory (STTRAM) cells, resistive random-access memory (RRAM) cells, or any other non-volatile memory cells.

A memory cell, e.g., an eDRAM cell, may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). One capacitor electrode of the capacitor of a 1T-1C memory cell may be coupled to one source/drain (S/D) terminal of the access transistor (e.g., to the source terminal of the access transistor), while the other S/D terminal of the access transistor may be coupled to a bitline (BL), and a gate terminal of the transistor may be coupled to a wordline (WL). The other capacitor electrode may be coupled to a plateline (PL). Since such a memory cell can be fabricated with as little as a single access transistor, it can provide higher density and lower standby power versus SRAM in the same process technology.

Various 1T-1C memory cells have, conventionally, been implemented with access transistors being FEOL, logic-process based, transistors implemented in an upper-most layer of a semiconductor substrate. Inventors of the present disclosure realized that using conventional logic transistors creates several challenges if such transistors are to be used to create three-dimensional (3D) memory and logic devices.

One challenge relates to the location of the capacitors such memory cells. Namely, it may be desirable to provide capacitors in metal layers close to their corresponding access transistors. Since logic transistors are implemented as FEOL transistors provided directly on the semiconductor substrate, the corresponding capacitors of 1T-1C memory cells then have to be embedded in lower metal layers in order to be close enough to the logic access transistors. As the pitches of lower metal layers aggressively scale in advanced technology nodes, embedding the capacitors in the lower metal layers poses significant challenges to the scaling of 1T-1C based memory and to creation of 3D memory devices.

Another challenge resides in that, given a usable surface area of a substrate, there are only so many FEOL transistors that can be formed in that area, placing a significant limitation on the density of memory cells or logic devices incorporating such transistors.

Embodiments of the present disclosure may improve on at least some of the challenges and issues described above. Conventional FEOL transistors have both S/D contacts on one side of the transistor, usually on the side facing away from the substrate. In contrast to the approaches of building logic and memory devices with such conventional FEOL transistors, various embodiments of the present disclosure provide transistors, various IC devices incorporating such transistors (e.g., logic devices, memory cells and arrays, etc.), as well as associated methods and larger devices, in which a transistor has one S/D contact on one side and another S/D contact on the other side. One side of a transistor may be referred to as a "front side" while the other side may be referred to as a "back side." Thus, transistors described herein have one of the S/D contacts on the front side (such contacts referred to as "front-side contacts") and the other one of their S/D contacts on the back side (such contacts referred to as "back-side contacts"). In the following, transistors having one front-side and one back-side S/D contacts may be simply referred to as "transistors with back-side contacts."

According to one aspect of the present disclosure, an example IC device includes a support structure (e.g., a substrate, a die, or a chip) on which one or more memory cells may be implemented. The IC device further includes a transistor that includes a channel material, a first S/D region, and a second S/D region. The IC device further includes a contact (i.e., an electrical contact) to the first S/D region and a contact to the second S/D region, where the contact to the first S/D region is in a first layer over the support structure, a portion of the channel material between the first S/D region and the second S/D region is in a second layer over the support structure, and the contact to the second S/D region is in a third layer over the support structure, and the second layer is between the first layer and the third layer. In general, in the context of the present disclosure, a "side" of a transistor refers to a region or a layer either above or below a layer of the channel material of the transistor. Thus, in such an example IC device, one of the two S/D regions has a contact on the front side of the transistor, i.e., a contact to that S/D region is on one side with respect to the layer of the channel material of the transistor (e.g., above the channel material), and such a contact is a front-side contact. On the other hand, the other one of the two S/D regions has a contact on the back side of the transistor, i.e., a contact to that S/D region is on the other side with respect to the layer of the channel material of the transistor (e.g., below the channel material), and such a contact is a back-side contact. In the context of the present disclosure, the term "above" may refer to being further away from the support structure or the FEOL of an IC device, while the term "below" refers to being closer towards the support structure or the FEOL of the IC device.

In the following, some descriptions may refer to a particular side of the transistor being referred to as a front side and the other side being referred to as a back side to illustrate the general concept of transistors having their S/D contacts on different sides. However, unless specified otherwise, which side of a transistor is considered to be a front side and which side is considered to be a back side is not important. Therefore, descriptions of some illustrative embodiments of the front and back sides provided herein are applicable to embodiments where the designation of front and back sides may be reversed, as long as one of the S/D contacts for a transistor is provided on one side and another one—on the other, with respect to the channel layer. Furthermore, some descriptions may refer to a particular S/D region or contact being either a source region/contact or a drain region/contact. However, unless specified otherwise, which region/contact of a transistor is considered to be a source region/contact and which region/contact is considered to be a drain region/contact is not important because, as is common in the field of field-effect transistors (FETs), designations of source and drain are often interchangeable. Therefore, descriptions of some illustrative embodiments of the source and drain regions/contacts provided herein are applicable to embodiments where the designation of source and drain regions/contacts may be reversed.

While some descriptions provided herein may refer to transistors being top-gated transistors, embodiments of the present disclosure are not limited to only this design and include transistors of various other architectures, or a mixture of different architectures. For example, in various embodiments, transistors having one front-side and one back-side S/D contacts, described herein, may include bottom-gated transistors, top-gated transistors, FinFETs, nanowire transistors, nanoribbon transistors, planar transistors, etc., all of which being within the scope of the present disclosure. Furthermore, although descriptions of the present disclosure may refer to memory cells provided in a given layer, each layer of the IC devices described herein may also include other types of devices besides memory cells described herein. For example, in some embodiments, IC devices with memory cells incorporating transistors having one front-side and one back-side S/D contacts may also include logic devices and/or memory cells of other types in any of the layers.

Using transistors with one front-side and one back-side S/D contacts provides several advantages and enables unique architectures that were not possible with conventional, FEOL logic transistors with both S/D contacts being on one side. One advantage is that such transistors may be moved to the back end of line (BEOL) layers of an advanced complementary metal oxide semiconductor (CMOS) process. Moving access transistors of memory cells to the BEOL layers means that their corresponding capacitors can be implemented in the upper metal layers with correspondingly thicker interlayer dielectric (ILD) and larger metal pitch to achieve higher capacitance, which may ease the integration challenge introduced by embedding the capacitors.

Another advantage is that implementing at least some of the transistors with their S/D contacts on different sides allows substantial flexibility in making electrical connections to these transistors. In particular, the back-side contacts of access transistors allow providing BLs and PLs on different sides of a layer that may include the channel material of the access transistors, which may provide substantial improvement with respect to increasing the density of memory arrays. In one aspect of the present disclosure, memory devices that include memory arrays where each memory cell includes an access transistor with one front-side and one back-side S/D contacts are disclosed. An example memory device may further include a BL and a PL, where the BL is coupled to the first S/D region of the access transistor of a first memory cell of the memory array and the PL may be coupled to a first capacitor electrode of the storage capacitor of the first memory cell. Because the access transistor is an access transistor with one front-side and one back-side S/D contacts, the BL may be provided in a first layer, the channel material—in a second layer, and the PL—in a third layer, where the second layer is between the first layer and the third layer, which may allow significantly increasing the density of memory cells in a memory device having a given footprint area (the footprint area being defined as an area in a plane of the substrate, or a plane parallel to the plane of the substrate, i.e., the x-y plane of an example coordinate system shown in the drawings of the present disclosure), or, conversely, significantly reducing the footprint area of a device with a given density of memory cells. Furthermore, by embedding at least some, but preferably all, of the access transistors and the corresponding capacitors in the upper metal layers (i.e., in layers away from the support structure) according to at least some embodiments of the present disclosure, the peripheral circuits that control the memory operation can be hidden below the memory area to substantially reduce the memory macro array (i.e., the footprint area in the x-y plane of an example coordinate system shown in the drawings of the present disclosure). Access transistors with back-side contacts as described herein may be used, for example, to address the scaling challenges of conventional 1T-1C memory technology and enable high density embedded memory compatible with an advanced CMOS process. Other technical effects will be evident from various embodiments described here.

As used herein, the term "metal layer" refers to a layer above a support structure that includes electrically conductive interconnect structures for providing electrical connectivity between different IC components. Metal layers described herein may also be referred to as "interconnect layers" to clearly indicate that these layers include electrically conductive interconnect structures which may, but do not have to, be metal.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5E, such a collection may be referred to herein without the letters, e.g., as "FIG. 5."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various memory arrays with access transistors having one front-side and one back-side S/D contacts as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Architectures of Access Transistors with Back-Side Contacts

FIG. 1 provides a schematic illustration of a cross-sectional view of an example access transistor 100, implemented as a FET, with one front-side and one back-side contact according to some embodiments of the present disclosure.

A number of elements labeled in FIG. 1 and in at least some of the subsequent figures with reference numerals are illustrated in these figures with different patterns, with a legend showing the correspondence between the reference numerals and patterns being provided at the bottom of each drawing page containing these figures. For example, the legend illustrates that FIG. 1 uses different patterns to show a channel material 102, S/D regions 104, contacts 106 to S/D regions, etc. Furthermore, although a certain number of a given element may be illustrated in FIG. 1 and in at least some of the subsequent figures, this is also simply for ease of illustration, and more, or less, than that number may be included in an IC device according to various embodiments of the present disclosure. Still further, various IC device views shown in FIG. 1 and in at least some of the subsequent figures are intended to show relative arrangements of various elements therein, and that various IC devices, or portions thereof, may include other elements or components that are not illustrated (e.g., any further materials, such as e.g. spacer materials that may surround the gate stack of the transistor 100, etch-stop materials, etc.).

In general, a FET, e.g., a metal oxide semiconductor (MOS) FET (MOSFET), is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material between the source and the drain regions, and, optionally, also includes a gate dielectric material between the gate electrode material and the channel material. This general structure is shown in FIG. 1, illustrating a channel material 102, S/D regions 104 (shown as a first S/D region 104-1, e.g., a source region, and a second S/D region 104-2, e.g., a drain region), contacts 106 to S/D regions (shown as a first S/D contact 106-1, providing electrical contact to the first S/D region 104-1, and a second S/D contact 106-2, providing electrical contact to the second S/D region 104-2), and a gate stack 108, which includes at least a gate electrode 110 and may also, optionally, include a gate dielectric 112.

Implementations of the present disclosure may be formed or carried out on a support structure, which may be, e.g., a substrate, a die, a wafer or a chip. The substrate may, e.g., be the wafer 2000 of FIG. 6A, discussed below, and may be, or be included in, a die, e.g., the singulated die 2002 of FIG. 6B, discussed below. The substrate may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the substrate may be a printed circuit board (PCB) substrate. Although a few examples of materials from which the substrate may be formed are described here, any material that may serve as a foundation upon which a memory array implementing any of the access transistors as transistors having one front-side and one back-side S/D contacts as described herein may be built falls within the spirit and scope of the present disclosure. In various embodiments, the channel material 102 may include, or may be formed upon, any such substrate material that provides a suitable surface for forming the transistor 100.

In some embodiments, the channel material 102 may be composed of semiconductor material systems including, for example, N-type or P-type materials systems. In some embodiments, the channel material 102 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material 102 may include a combination of semiconductor materials where one semiconductor material may be used for the channel portion (e.g., a portion 114 shown in FIG. 1, which is supposed to refer to the upper-most portion of the channel material 102) and another material, sometimes referred to as a "blocking material," may be used between the channel portion 114 and the support structure over which the transistor 100 is provided. In some embodiments, the channel material 102 may include a monocrystalline semiconductor, such as silicon (Si) or germanium (Ge). In some embodiments, the channel material 102 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 100 is an NMOS), the channel portion 114 of the channel material 102 may advantageously include a III-V material having a high electron mobility, such as, but not limited to InGaAs, InP, InSb, and InAs. For some such embodiments, the channel portion 114 of the channel material 102 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion 114 of the channel material 102 may be an intrinsic III-V material, i.e., a III-V semiconductor material not intentionally doped with any electrically active impurity. In alternate embodiments, a nominal impurity dopant level may be present within the channel portion 114 of the channel material 102, for example to further fine-tune a threshold voltage Vt, or to provide HALO pocket implants, etc. Even for impurity-doped embodiments however, impurity dopant level within the channel portion 114 of the channel material 102 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 100 is a PMOS), the channel portion 114 of the channel material 102 may advantageously be a group IV material having a high hole mobility, such as, but not limited to Ge or a Ge-rich SiGe alloy. For some example embodiments, the channel portion 114 of the channel material 102 may have a Ge content between 0.6 and 0.9, and advantageously may be at least 0.7. In some embodiments with highest mobility, the channel portion 114 may be intrinsic III-V (or IV for P-type devices) material and not intentionally doped with any electrically active impurity. In alternate embodiments, one or more a nominal impurity dopant level may be present within the channel portion 114, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

In some embodiments, the transistor 100 may be a thin film transistor (TFT). A TFT is a special kind of a field-effect transistor made by depositing a thin film of an active semiconductor material, as well as a dielectric layer and metallic contacts, over a supporting layer that may be a non-conducting layer. At least a portion of the active semiconductor material forms a channel of the TFT. If the transistor 100 is a TFT, the channel material 102 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor 100 is a TFT, the channel material 102 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material 102 may have a thickness between about 5 and 75 nanometers, including all values and ranges therein. In some embodiments, a thin film channel material 102 may be deposited at relatively low temperatures, which allows depositing the channel material 102 within the thermal budgets imposed on back end fabrication to avoid damaging other components, e.g., front end components such as the logic devices.

As shown in FIG. 1, a first and a second S/D regions 104-1, 104-2 (together referred to as "S/D regions 104") may be included on either side of the gate stack 108, thus realizing a transistor. As is known in the art, source and drain regions (also sometimes interchangeably referred to as "diffusion regions") are formed for the gate stack of a FET. In some embodiments, the S/D regions 104 of the transistor 100 may be regions of doped semiconductors, e.g. regions of the channel material 102 (e.g., of the channel portion 114) doped with a suitable dopant to a desired dopant concentration, so as to supply charge carriers for the transistor channel. In some embodiments, the S/D regions 104 may be highly doped, e.g. with dopant concentrations of about $1 \cdot 10^{21}$ $cm^{-3}$, in order to advantageously form Ohmic contacts with the respective S/D contacts 106, although, in other embodiments, these regions may also have lower dopant concentrations and may form Schottky contacts in some implementations. Irrespective of the exact doping levels, the S/D regions 104 of the transistor 100 may be the regions having dopant concentration higher than in other regions, e.g. higher than a dopant concentration in a region of the channel material 102 between the first S/D region 104-1 and the second S/D region 104-2, and, therefore, may be referred to as "highly doped" (HD) regions. In some embodiments, the S/D regions 104 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the channel material 102 to form the S/D regions 104. An annealing process that activates the dopants and causes them to diffuse further into the channel material 102 may follow the ion implantation process. In the latter process, the one or more semiconductor materials of the channel material 102 may first be etched to form recesses at the locations for the future S/D regions. An epitaxial deposition process may then be carried out to fill the recesses with material (which may include a combination of different materials) that is used to fabricate the S/D regions 104. In some implementations, the S/D regions 104 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 104 may be formed using one or more alternate semiconductor materials such as germanium or a group III-V material or alloy. Although FIG. 1 illustrates the first and second S/D regions 104 with a single pattern, suggesting that the material composition of the first and second S/D regions 104 is the same, this may not be the case in some other embodiments of the transistor 100. Thus, in some embodiments, the material composition of the first S/D region 104-1 may be different from the material composition of the second S/D region 104-2.

As further shown in FIG. 1, S/D contacts 106-1 and 106-2 (together referred to as "S/D contacts 106"), formed of one or more electrically conductive materials, may be used for providing electrical connectivity to the S/D regions 104-1 and 104-2, respectively. In various embodiments, one or more layers of metal and/or metal alloys may be used to form the S/D contacts 106. For example, the electrically conductive materials of the S/D contacts 106 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the S/D contacts 106 may include one or more electrically conductive alloys, oxides, or carbides of one or more metals. In some embodiments, the S/D contacts 106 may include a doped semiconductor, such as silicon or another semiconductor doped with an N-type dopant or a P-type dopant. Metals may provide higher conductivity, while doped semiconductors may be easier to pattern during fabrication. Although FIG. 1 illustrates the first and second S/D contacts 106 with a single pattern, suggesting that the material composition of the first and second S/D contacts 106 is the same, this may not be the case in some other embodiments of the transistor 100. Thus, in some embodiments, the material composition of the first S/D contact 106-1 may be different from the material composition of the second S/D contact 106-2.

Turning to the gate stack 108, the gate electrode 110 may include at least one P-type work function metal or N-type work function metal, depending on whether the transistor 100 is a P-type metal oxide semiconductor (PMOS) transistor or an N-type metal oxide semiconductor (NMOS) transistor. For a PMOS transistor, metals that may be used for the gate electrode 110 may include, but are not limited to, ruthenium, palladium, platinum, cobalt, nickel, and conductive metal oxides (e.g., ruthenium oxide). For an NMOS transistor, metals that may be used for the gate electrode 110 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 110 may include a stack of two or more metal layers, where one or more metal layers are WF metal layers and at least one metal layer is a fill metal layer. Further metal layers may be included for other purposes, such as to act as a diffusion barrier layer, described below.

If used, the gate dielectric 112 may at least laterally surround the channel portion 114, and the gate electrode 110 may laterally surround the gate dielectric 112 such that the gate dielectric 112 is disposed between the gate electrode 110 and the channel material 104. In various embodiments, the gate dielectric 112 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 112 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 112 during manufacture of the transistor 100 to improve the quality of the gate dielectric 112. In some embodiments, the gate dielectric 112 may have a thickness between about 0.5 nanometers and 3 nanometers, including all values and ranges therein, e.g., between about 1 and 3 nanometers, or between about 1 and 2 nanometers.

In some embodiments, the gate dielectric 112 may be a multilayer gate dielectric, e.g., it may include any of the high-k dielectric materials in one layer and a layer of indium gallium zinc oxide (IGZO). In some embodiments, the gate stack 108 may be arranged so that the IGZO is disposed between the high-k dielectric and the channel material 104. In such embodiments, the IGZO may be in contact with the channel material 104 and may provide the interface between the channel material 104 and the remainder of the multilayer gate dielectric 112. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

In some embodiments, the gate stack 108 may be surrounded by a dielectric spacer, not specifically shown in FIG. 1. The dielectric spacer may be configured to provide separation between the gate stacks 108 of different transistors 100 which may be provided adjacent to one another (e.g., different transistors 100 provided along a single fin if the transistors 100 are FinFETs), as well as between the gate stack 108 and one of the S/D contacts 106 that is disposed on the same side as the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

In stark contrast to conventional implementations where both S/D contacts are typically provided on a single side of a transistor, typically on the front side, e.g., where the gate stack 108 is provided, the two S/D contacts 106 are provided on different sides. Namely, as shown in FIG. 1, the second S/D contact 106-2 is provided on the same side as the gate stack 108, which may be considered to be the front side of the transistor 100, while the first S/D contact 106-1 is provided on the opposite side, which may be considered to be the back side of the transistor 100. Thus, the first S/D contact 106-1 is the back-side contact and the second S/D contact 106-2 is the front-side contact of the transistor 100. If considering the layers above a support structure (not shown in FIG. 1) over which the entire transistor 100 is built, then the first S/D contact 106-1 may be considered to be in a first layer 120-1 above the support structure, a portion of the channel material 102 between the first S/D region 104-1 and the second S/D region 104-2 (e.g., the channel portion 114) may be considered to be in a second layer 120-2 above the support structure, and the second S/D contact 106-2 is in a third layer 120-3 over the support structure. As can be seen from FIG. 1, the second layer 120-2 is between the first layer 120-1 and the third layer 120-3. At least a portion of the gate stack 108, or a contact to the gate stack 108 (such a gate contact not specifically shown in FIG. 1), may be provided in the same layer as one of the S/D contacts 106, e.g., in the third layer 120-3, as shown in FIG. 1.

Transistors having one front-side and one back-side S/D contacts as described herein, such as the transistor 100, may be implemented using any suitable transistor architecture, e.g. planar or non-planar architectures. One example structure is shown in FIGS. 2A-2B, illustrating perspective and cross-sectional views, respectively, of an example IC device 200 having a transistor with a back-side contact implemented as a FinFET, according to some embodiments of the present disclosure. Thus, the IC device 200 illustrates one example implementation of the transistor 100. Therefore, some of the reference numerals shown in FIGS. 2A-2B are the same as those used in FIG. 1, indicating the same or similar elements as those described with reference to FIG. 1, so that their descriptions are not repeated for FIGS. 2A-2B.

FinFETs refer to transistors having a non-planar architecture where a fin, formed of one or more semiconductor materials, extends away from a base (where the term "base" refers to any suitable support structure on which a transistor may be built, e.g., a substrate). A portion of the fin that is closest to the base may be enclosed by an insulator material. Such an insulator material, typically an oxide, is commonly referred to as a "shallow trench isolation" (STI), and the portion of the fin enclosed by the STI is typically referred to as a "subfin portion" or simply a "subfin." A gate stack that includes at least a layer of a gate electrode material and, optionally, a layer of a gate dielectric may be provided over the top and sides of the remaining upper portion of the fin (i.e. the portion above and not enclosed by the STI), thus wrapping around the upper-most portion of the fin. The portion of the fin over which the gate stack wraps around is typically referred to as a "channel portion" of the fin because this is where, during operation of the transistor, a conductive channel forms, and is a part of an active region of the fin. A source region and a drain region are provided on the opposite sides of the gate stack, forming, respectively, a source and a drain terminal of a transistor. FinFETs may be implemented as "tri-gate transistors," where the name "tri-gate" originates from the fact that, in use, such transistors may form conducting channels on three "sides" of the fin. FinFETs potentially improve performance relative to single-gate transistors and double-gate transistors.

FIG. 2A is a perspective view, while FIG. 2B is a cross-sectional side view of an IC device/Fin FET 200 with one front-side and one back-side S/D contact, according to some embodiments of the disclosure. FIGS. 2A-2B illustrate the channel material 102, the S/D regions 104, and the gate stack 108 showing the gate electrode 110 and the gate dielectric 112 as described above. As shown in FIGS. 2A-2B, when the transistor 100 is implemented as a FinFET, the FinFET 200 may further include a base 202, a fin 204, and an STI material 206 enclosing the subfin portion of the fin 204. The S/D contacts 106 are not specifically shown in FIGS. 2A-2B in order to not clutter the drawings. The cross-sectional side view of FIG. 2B is the view in the y-z plane of the example coordinate system x-y-z shown in FIG. 2A, with the cross section of FIG. 2B taken across the fin 204 (e.g., along the plane shown in FIG. 2A as a plane AA). On the other hand, the cross-sectional side view of FIG. 1 is the view in the x-z plane of the example coordinate system shown in FIG. 2A with the cross section taken along the fin 204 for one example portion of the gate stack 108 (e.g., along the plane shown in FIG. 2A and in FIG. 2B as a plane BB).

As shown in FIGS. 2A-2B, the fin 204 may extend away from the base 202 and may be substantially perpendicular to the base 202. The fin 204 may include one or more semiconductor materials, e.g. a stack of semiconductor materials, so that the upper-most portion of the fin (namely, the portion of the fin 204 enclosed by the gate stack 108) may serve as the channel region of the FinFET 200. Therefore, the upper-most portion of the fin 204 may be formed of the channel material 102 as described above and may include the channel portion 114.

The subfin of the fin 204 may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth. For some example N-type transistor embodiments, the subfin portion of the fin 204 may be a III-V material having a band offset (e.g., conduction band offset for N-type devices) from the channel portion. Example materials include, but are not limited to, GaAs, GaSb, GaAsSb, GaP, InAlAs, GaAsSb, AlAs, AlP, AlSb, and AlGaAs. In some N-type transistor embodiments of the FinFET 200 where the channel portion of the fin 204 (e.g., the channel portion 114) is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 204 are each, or include, group IV semiconductors (e.g., Si, Ge, SiGe). The subfin of the fin 204 may be a first elemental semiconductor (e.g., Si or Ge) or a first SiGe alloy (e.g., having a wide bandgap). For some example P-type transistor embodiments, the subfin of the fin 204 may be a group IV material having a band offset (e.g., valance band offset for P-type devices) from the channel portion. Example materials include, but are not limited to, Si or Si-rich SiGe. In some P-type transistor embodiments, the subfin of the fin 204 is Si and at least a portion of the subfin may also be doped with impurities (e.g., N-type) to a higher impurity level than the channel portion.

As further shown in FIGS. 2A-2B, the STI material 206 may enclose portions of the sides of the fin 204. A portion of the fin 204 enclosed by the STI 206 forms a subfin. In various embodiments, the STI material 206 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 206 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

The gate stack 108 may wrap around the upper portion of the fin 204 (the portion above the STI 206), as shown in FIGS. 2A-2B, with a channel portion of the fin 204 (e.g., the channel portion 114, described above) corresponding to the portion of the fin 204 wrapped by the gate stack 108 as shown in FIGS. 2A-2B. In particular, the gate dielectric 112 (if used) may wrap around the upper-most portion of the fin 204, and the gate electrode 110 may wrap around the gate dielectric 112. The interface between the channel portion and the subfin portion of the fin 204 is located proximate to where the gate electrode 110 ends.

In some embodiments, the FinFET 200 may have a gate length, GL, (i.e. a distance between the first S/D region 104-1 and the second S/D region 104-2), a dimension measured along the fin 204 in the direction of the x-axis of the example reference coordinate system x-y-z shown in FIG. 1 and FIGS. 2A-2B, which may, in some embodiments, be between about 5 and 40 nanometers, including all values and ranges therein (e.g. between about 22 and 35 nanometers, or between about 20 and 30 nanometers). The fin 204 may have a thickness, a dimension measured in the direction of the y-axis of the reference coordinate system x-y-z shown in FIGS. 2A-2B, that may, in some embodiments, be between about 5 and 30 nanometers, including all values and ranges therein (e.g. between about 7 and 20 nanometers, or between about 10 and 15 nanometers). The fin 204 may have a height, a dimension measured in the direction of the z-axis of the reference coordinate system x-y-z shown in FIG. 1, which may, in some embodiments, be between about 30 and 350 nanometers, including all values and ranges therein (e.g. between about 30 and 200 nanometers, between about 75 and 250 nanometers, or between about 150 and 300 nanometers).

Although the fin 204 illustrated in FIGS. 2A-2B is shown as having a rectangular cross section in a y-z plane of the reference coordinate system shown, the fin 204 may instead have a cross section that is rounded or sloped at the "top" of the fin 204, and the gate stack 108 may conform to this rounded or sloped fin 204. In use, the FinFET 200 may form conducting channels on three "sides" of the channel portion of the fin 204, potentially improving performance relative to single-gate transistors (which may form conducting channels on one "side" of a channel material or substrate) and double-gate transistors (which may form conducting channels on two "sides" of a channel material or substrate).

While not specifically shown in FIG. 2A, S/D contacts 106 may be electrically connected to the S/D regions 104 but extending in different vertical directions with respect to the fin 204. For example, the first S/D contact 106-1 may be electrically connected to the first S/D region 104-1 and extend from the first S/D region 104-1 towards the base 202, thus forming a back-side S/D contact for the FinFET 200, similar to the illustration of FIG. 1. In such implementation, the second S/D contact 106-2 may be electrically connected to the second S/D region 104-2 and extend from the second S/D region 104-2 away from the base 202, thus forming a front-side S/D contact for the FinFET 200, also similar to the illustration of FIG. 1.

While FIGS. 2A-2B illustrate a single FinFET 200, in some embodiments, a plurality of FinFETs may be arranged next to one another (with some spacing in between) along the fin 204. Furthermore, in various further embodiments, the transistor 100 with one front-side and one back-side S/D contacts may be implemented in many other transistor architectures besides the FinFET 200, such as planar transistors, nanowire transistors, or nanoribbon transistors.

Example Memory Cell

FIG. 3 provides a schematic illustration of a cross-sectional view of an example memory cell 300 that includes a transistor with a back-side contact, according to some embodiments of the present disclosure. FIG. 3 illustrates how the transistor 100 may be used to form a 1T-1C memory cell. In particular, the memory cell 300 illustrates all of the components of the transistor 100 of FIG. 1 (the descriptions of which, therefore, not repeated here), and further schematically illustrates that, in some embodiments, a capacitor 302 may be coupled to the back-side S/D contact 106-1 of the transistor 100. The capacitor 302 may be any suitable capacitor, e.g., a metal-insulator-metal (MIM) capacitor for storing a bit value, or a memory state (e.g., logical "1" or "0") of the memory cell 300, and the transistor 100 may then function as an access transistor controlling access to the memory cell 300 (e.g., access to write information to the cell or access to read information from the cell. One example implementation of the capacitor 302 is shown in the cross-sectional view of FIG. 5D, however other ways of implementing the capacitor 302 as having a first capacitor electrode, a second capacitor electrode, and an insulator material between the first and second capacitor electrodes are possible and within the scope of the present disclosure. By coupling one electrode of the capacitor 302 to the S/D region 104-1, the capacitor 302 is configured to store the memory state of the memory cell 300. In some embodiments, the capacitor 302 may be coupled to the S/D region 104-1 via a storage node (not specifically shown in FIG. 3) coupled to the S/D region 104-1. In some embodiments, the S/D contact 106-1 may be considered to be the storage node.

Although not specifically shown in FIG. 3, the memory cell 300 may further include a bitline to transfer the memory state and coupled to the one of the S/D regions 104 to which the capacitor 302 is not coupled (e.g., to the S/D region 104-2, via the S/D contacts 106-2, for the illustration of FIG. 3). Such a bitline can be connected to a sense amplifier and a bitline driver which may, e.g., be provided in a memory peripheral circuit associated with a memory array in which the memory cell 300 may be included. Furthermore, although also not specifically shown in FIG. 3, the memory cell 300 may further include a wordline, coupled to the gate terminal of the transistor 100, e.g., coupled to the gate stack 108, to supply a gate signal. The transistor 100 may be configured to control transfer of a memory state of the memory cell 300 between the bitline and the storage node or the capacitor 302 in response to the gate signal.

FIG. 4 is a schematic illustration of an electric circuit diagram of a 1T-1C memory cell 400 according to some embodiments of the present disclosure. The memory cell 400 is an example of the memory cell 300, shown in FIG. 3, but illustrating a different representation. Similar to FIG. 3, FIG. 4 illustrates how the transistor 100 and the capacitor 302 may be used to form a 1T-1C memory cell. In particular, the memory cell 400 illustrates the S/D regions 104 and the gate stack 108 of the transistor 100 of FIG. 1 and further illustrates the capacitor 302 coupled to one of the S/D regions 104 of the transistor 100, where the capacitor 302 is shown to include a first capacitor electrode 404-1 and a second capacitor electrode 404-2, and an insulator material 406 between the first and second capacitor electrodes 404. In addition to what was shown in FIGS. 1 and 3 and described above, the memory cell 400 further illustrates a bitline 440 (labeled in FIG. 4 as "BL"), a wordline 450 (labeled in FIG. 4 as "WL") and a plateline 460 (labeled in FIG. 4 as "PL"). Each of the bitline 440, the wordline 450, and the plateline 460, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as copper, ruthenium, palladium, platinum, cobalt, nickel, hafnium, zirconium, titanium, tantalum, aluminum, tantalum nitride, tungsten, doped silicon, doped germanium, or alloys and mixtures of any of these. In some embodiments, such electrically conductive materials may include one or more electrically conductive alloys oxides or carbides of one or more metals.

As shown in FIG. 4, in the 1T-1C memory cell 400, the gate terminal (e.g., the gate stack 108) of the access transistor 100 is coupled to the wordline 450, the first S/D terminal (e.g., the first S/D region 104-1) is coupled to the capacitor 302, and the second S/D terminal (e.g., the second S/D region 104-2) is coupled to the bitline 440. In particular, the first S/D region 101-4 is coupled to the first capacitor electrode 404-1, while the second capacitor electrode 404-2 is coupled to the plateline 460. As is known in the art, the wordlines, bitlines, and platelines may be used together to read and program the capacitor 302. However, in sharp contrast to conventional implementations where the bitlines and platelines usually have to be routed on the same side of the channel material of a given layer of memory cells, because of the architecture of the access transistor 100 having one front-side and one back-side S/D contact, bitlines and platelines may now be routed on different sides, which may enable placing individual memory cells of a memory array closer to one another. Example routing of wordlines, bitlines, and platelines will now be explained with reference to FIGS. 5A-5E.

Example Routing of Bitlines and Platelines

Figure 5A:
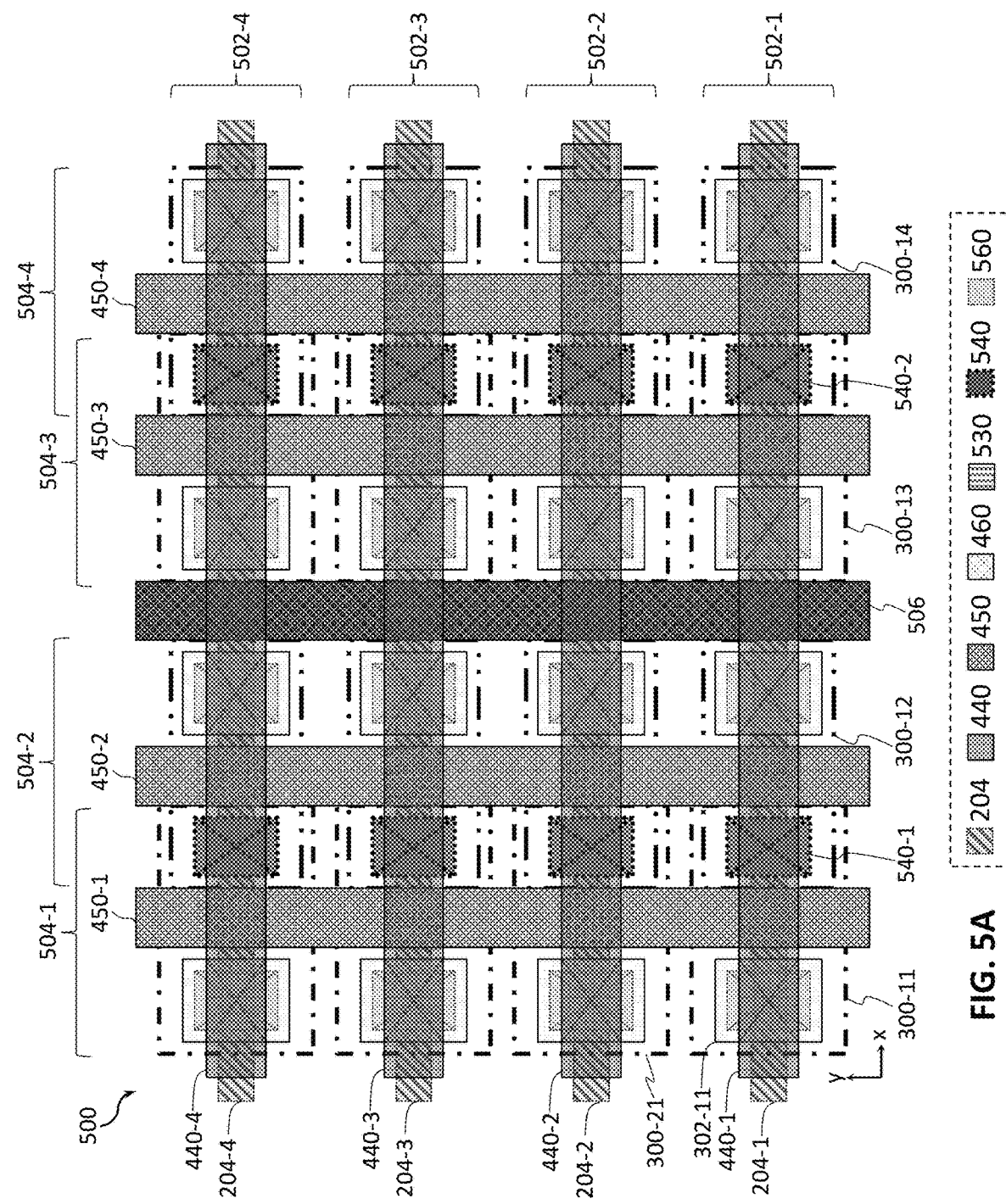
FIGS. 5A-5E provide different schematic illustrations of top-down and cross-sectional views of an integrated circuit (IC) memory device with densely spaced memory cells utilizing access transistors with back-side contacts, according to some embodiments of the present disclosure.
Figure 5B:
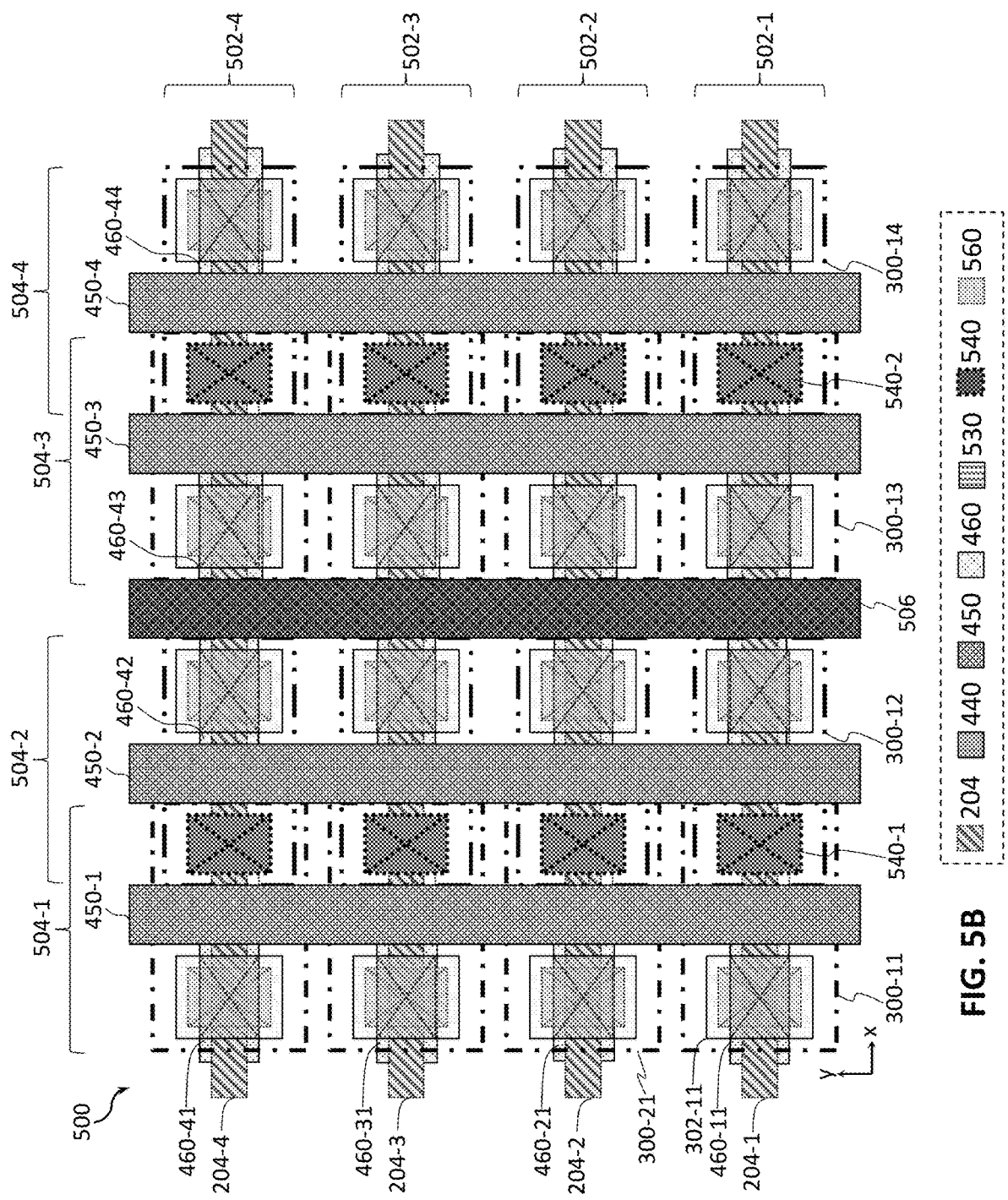
Figure 5C:
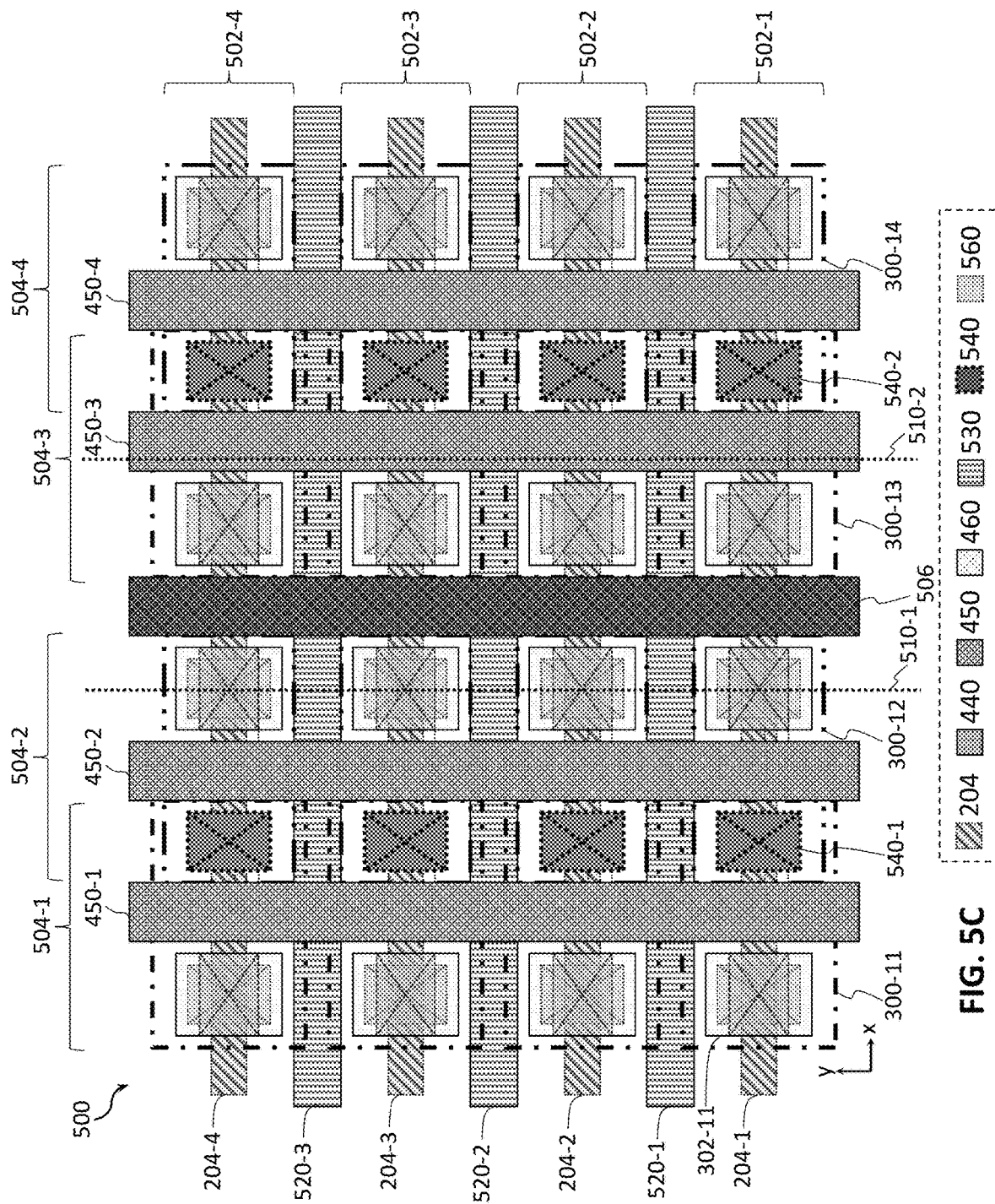
Figure 5D:
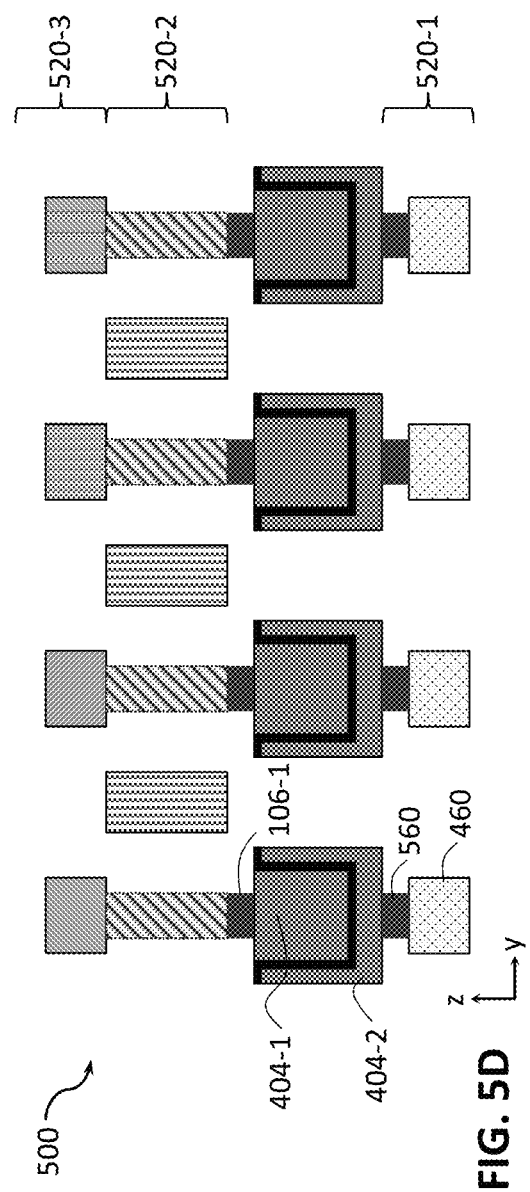
Figure 5E:
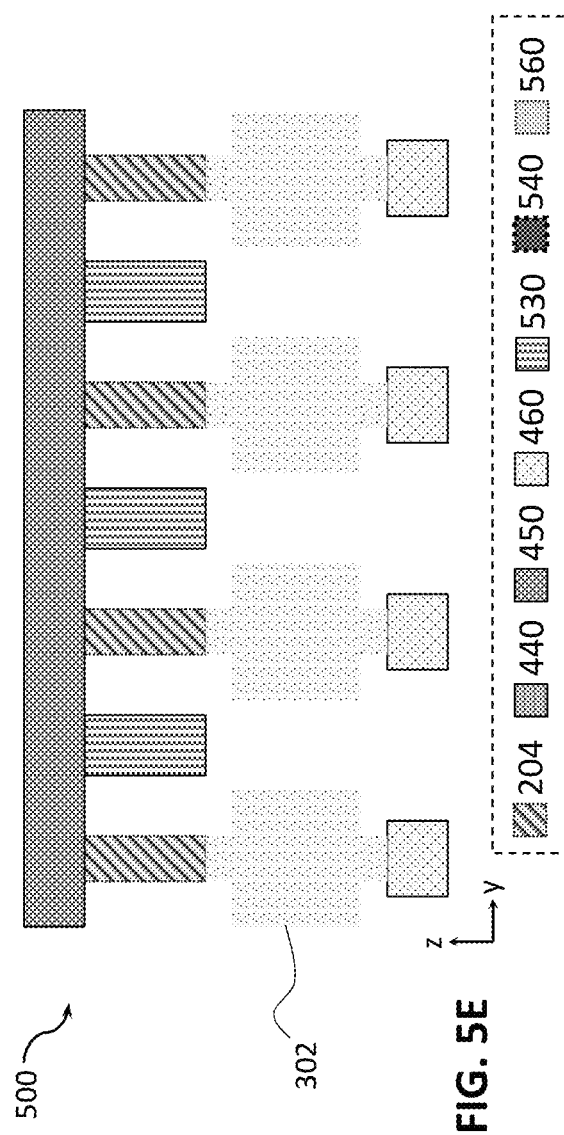

FIGS. 5A-5E provide different schematic illustrations of top-down and cross-sectional views of an IC device 500 with densely spaced memory cells utilizing access transistors with back-side contacts, according to some embodiments of the present disclosure. FIGS. 5A-5C illustrate top-down views of the same portion of the IC device 500 but where different figures illustrate different elements because showing all of the elements in a single drawing would make the drawing too complicated and difficult to understand. In particular, FIG. 5A illustrates a top-down view of the IC device 500 where the bitlines are shown but the platelines and the SAGE walls are not shown (although they are present in the locations as shown in FIGS. 5B and 5C, respectively), FIG. 5B illustrates a top-down view of the IC device 500 where the platelines are shown but the bitlines and the SAGE walls are not shown, and FIG. 5C illustrates a top-down view of the IC device 500 where the SAGE walls are shown but the bitlines and the platelines are not shown. FIGS. 5D-5E illustrate cross-sectional side views of the IC device 500 with the cross-sections taken, respectively, along the planes 510-1 and 510-2 shown in FIG. 5C.

Although specific numbers of elements are shown in FIG. 5, e.g., a specific number of bitlines, a specific number of wordlines, a specific number of SAGE walls, etc., the IC device 500 may include any other suitable numbers of such elements. In FIG. 5, elements labeled with reference numerals used in FIGS. 1-4 are intended to represent the same or analogous elements as those shown in FIGS. 1-4. Different instances of the same type of element are labeled in FIG. 5 with a reference numeral after a dash, e.g., a first instance of the bitline 440 is shown as a bitline 440-1, a second instance of the bitline 440 is shown as a bitline 440-2, and so on. In order to not clutter the drawings, not all individual instances of all elements are specifically labeled in FIG. 5. For example, only memory cells 300 of the first row 502-1 are labeled as memory cells 300-11, 300-12, 300-13, and 300-14, where other rows may include similar arrangements of memory cells. Furthermore, some elements are distinguished in FIG. 5 by being shown with a different pattern and are not specifically labeled with a reference numeral, with the correspondence between different reference numerals referred to in the present description and patterns shown in FIG. 5 provided within a dashed box at the bottom of each page of the drawings of FIG. 5. In addition, while FIGS. 5A-5C are intended to illustrate top down view, some of the elements provided in a plane below the view of each of these drawings which would normally be obscured by other elements in such a view, e.g., fins 204, are still shown, although outlined with dotted lines. The z-height relationship of various elements of the memory array 500 becomes clear from the cross-sectional side views of FIGS. 5D-5E and descriptions provided herein.

As shown in FIG. 5, the memory array 500 may include a plurality of memory cells 300 which may be arranged in rows 502 and columns 504. The example of FIG. 5 illustrates four rows, labeled as rows 502-1 through 502-4, and illustrates four columns, labeled as columns 504-1 through 504-4. For example, as shown in FIG. 5, the row 502-1 may include the memory cells 300-11, 300-12, 300-13, and 300-14, the row 502-2 may include the memory cell 300-21, and so on. Each memory cell 300 of the IC device 500 may include an access transistor, e.g., the access transistor 100, and a capacitor, e.g., the capacitor 302. In the example of the IC device 500 all of the memory cells are shown to have their access transistors implemented as the access transistor 100, but, in general, at least some memory cells of the IC device 500 may include access transistors implemented in different manners. In some embodiments of the IC device 500, the access transistors of the memory cells 300 of a given row 502 may be provided along a single fin 204, as shown in FIG. 5 with the memory cells 300 of the four rows 502 provided along respective one of the four fins 204, labeled as fins 204-1 through 204-4. In other embodiments of the IC device 500, the access transistors of the memory cells 300 of a given row 502 may include separate channel materials, and/or the fins 204 may be replaced with nanowires or nanoribbons instead.

In some embodiments, the different memory cells 300 of a given row 502 may be coupled to a single, shared bitline 440. This is shown in FIG. 5A illustrating four bitlines 440, labeled as bitlines 440-1 through 440-4, where the memory cells of the row 502-1 are coupled to the bitline 440-1, the memory cells of the row 502-2 are coupled to the bitline 440-2, the memory cells of the row 502-3 are coupled to the bitline 440-3, and the memory cells of the row 502-4 are coupled to the bitline 440-4. In particular, the second S/D region 104-2 of the access transistors 100 of these memory cells may be coupled to these bitlines 440, via a respective bitline contact 540 (two instances of which being labeled in FIG. 5A with reference numerals 540-1 and 540-2 for the memory cell 300 of the row 502-1, but other instances being shown in FIG. 5 with the same patterns).

In some embodiments, some pairs of the memory cells of a given row 502 in the IC device 500 may be provided so that one of their S/D regions of their access transistors is either coupled together or shared. This is shown in FIG. 5, e.g., for the memory cells 300-11 and 300-12, where the second S/D region 104-2 of the memory cell 300-11 is coupled or shared (e.g., electrically continuous with) the second S/D region 104-2 of the memory cell 300-12, and both of these second S/D regions 104-2 are coupled to the bitline 440-1, via the bitline contact 540, corresponding to the row 502-1. This is also shown in FIG. 5 for the memory cells 300-13 and 300-14, where the second S/D region 104-2 of the memory cell 300-13 is coupled or shared (e.g., electrically continuous with) the second S/D region 104-2 of the memory cell 300-14, and both of these second S/D regions 104-2 are coupled to the bitline 440-1, via the bitline contact 540-2, corresponding to the row 502-1. On the other hand, the pairs of memory cells of a given row which have their S/D regions shared/coupled, may be electrically de-coupled, or isolated, from one another, as is shown in FIG. 5 with an isolation structure 506, providing electrical isolation between the memory cell 300-12 and the memory cell 300-13 for the row 502-1, between the memory cell 300-22 and the memory cell 300-23 for the row 502-2, and so on. In some embodiments, the isolation structure 506 may include a cut in the fins 204, which cut may subsequently be filled with some insulator material, e.g., any of the insulator/dielectric materials described herein.

As further shown in FIG. 5, in some embodiments, the different memory cells 300 of a given column 504 may be coupled to a single, shared wordline 450. This is shown in FIG. 5A illustrating four wordlines 450, labeled as wordlines 450-1 through 450-4, where the memory cells of the column 504-1 are coupled to the wordline 450-1, the memory cells of the column 504-2 are coupled to the wordline 450-2, the memory cells of the column 504-3 are coupled to the wordline 450-3, and the memory cells of the column 504-4 are coupled to the wordline 450-4. In particular, the gate stack 108 of the access transistors 100 of these memory cells may be coupled to these wordlines 450, e.g., via a respective wordline contact (not specifically shown in FIG. 5).

In some embodiments, the different memory cells 300 may be coupled to different platelines 460. This is shown in FIG. 5B illustrating four platelines 460 per each row 502 (each plateline for each of the four memory cells 300 shown in a given row 502 in FIG. 5), labeled as platelines 460-41 through 460-44 for the roe 502-4 (other instances of the platelines 460 not specifically labeled in FIG. 5B in order to not clutter the drawing), where the memory cell 300-41 is coupled to the plateline 460-41, the memory cell 300-42 is coupled to the plateline 460-42, the memory cell 300-43 is coupled to the plateline 460-43, and the memory cell 300-44 is coupled to the plateline 460-44. In particular, it is the second capacitor electrode 404-2 of the capacitor 302 of these memory cells that may be coupled to these platelines 460, via a respective plateline contact 560. The cross-sectional illustration of FIG. 5D provides further details about how the capacitor 302 may be implemented as a three-dimensional capacitor in some embodiments, and how the respective first S/D contacts 106-1 may be used to couple the first capacitor electrodes 404-1 to the first S/D regions 104-1 of the respective fins 204, and how the respective plateline contacts 560 may be used to couple the second capacitor electrodes 404-2 to the respective platelines 460. The cross-sectional illustration of FIG. 5E also illustrates the capacitors 302 but now shown with a different pattern and without showing the details, because the capacitors 302 are not in the plane of the view of the side cross-section of FIG. 5E.

The view of FIG. 5D illustrates how using access transistors 100 with one front-side and one back-side S/D contacts advantageously allows providing bitlines and platelines in different planes along the z-axis, with respect to the channel material of the access transistors 100. For example, as shown in FIG. 5D, in some embodiments, the platelines 460 may be placed in a first layer 520-1, the channel material of the access transistors 100 may be placed in a second layer 520-2, and the bitlines 440 may be placed in a third layer 520-3, where the second layer 520-2 is between the first layer 520-1 and the third layer 520-3. In some embodiments, a projection of a given bitline 440 associated with a given row 502 of the memory cells 300 may at least partially, or completely, overlap with a projection of the platelines 460 coupled to the memory cells 300 of that row, where the projections are on a given plane parallel to the support structure over which the IC device 500 is provided, e.g., the support structure 202. The overlap between these elements is discussed in context of "projections" on a given plane because the bitlines 440 and the platelines 460 are in different planes, so, strictly speaking form the geometry considerations, they do not overlap, but their projections on a single common plane may. On the other hand, the projections of different platelines 460 associated with the memory cells 300 of a given row 502 may not overlap, i.e., may be different, from one another, to ensure separate electrical coupling of these memory cells to individual platelines 460.

In some embodiments, providing bitlines and platelines in different planes along the z-axis as described herein allows placing different fins 204 closer to one another. This kind of scaling to smaller distances enables increased densities of the memory cells 300 on the limited real estate of semiconductor chips. Such scaling, however, is not without issue. Therefore, in some embodiments, self-aligned gate end (SAGE) isolations structures 530 (also sometimes commonly referred to as "SAGE walls") may be provided between adjacent fins 204, as shown, e.g., in FIGS. 5C, 5D, and 5E. The SAGE isolations structures 530 may be any suitable isolating structures and may have shapes other than shown in FIG. 5, to provide isolation between the circuit elements provided along different fins 204. In some embodiments, the SAGE isolations structures 530 may be made of one or more electrically insulating materials, e.g., composed of a material or materials suitable to ultimately electrically isolate, or contribute to the isolation of, portions of gate structures along the different fins 204 from one another. Exemplary materials or material combinations for the SAGE isolation structure 530 include a single material structure such as silicon dioxide, silicon oxy-nitride, silicon nitride, or carbon-doped silicon nitride. Other exemplary materials or material combinations for the SAGE isolation structures 530 include a multi-layer stack having lower portion silicon dioxide, silicon oxy-nitride, silicon nitride, or carbon-doped silicon nitride and an upper portion higher dielectric constant material such as hafnium oxide.

Using the SAGE architecture may allow reducing the connection to the S/D regions, allowing to reduce contact resistance at a smallest area and enabling creation of small transistor geometries down to a few nanometers and below to continue logic and memory transistor scaling.

Variations and Implementations

Various device assemblies illustrated in FIGS. 1-5 do not represent an exhaustive set of IC devices with access transistors having one front-side and one back-side S/D contacts as described herein, but merely provide examples of such devices/structures/assemblies. In particular, the number and positions of various elements shown in FIGS. 1-5 is purely illustrative and, in various other embodiments, other numbers of these elements, provided in other locations relative to one another may be used in accordance with the general architecture considerations described herein. For example, in some embodiments, logic devices may include in any of the IC devices shown in FIG. 5, either in the same or separate metal layers from those in which the memory cells are shown.

Further, FIGS. 1-5 are intended to show relative arrangements of the elements therein, and the device assemblies of these figures may include other elements that are not specifically illustrated (e.g., various interfacial layers). Similarly, although particular arrangements of materials are discussed with reference to FIGS. 1-5, intermediate materials may be included in the IC devices and assemblies of these figures. Still further, although some elements of the various top-down or cross-sectional views are illustrated in FIGS. 1-5 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of the access transistors having one front-side and one back-side S/D contacts as described herein.

Fabrication Methods

IC devices and memory arrays with access transistors having one front-side and one back-side S/D contacts, as described herein, may be fabricated using any suitable techniques, e.g., subtractive, additive, damascene, dual damascene, etc. Some of such technique may include suitable deposition and patterning techniques. As used herein, "patterning" may refer to forming a pattern in one or more materials using any suitable techniques (e.g., applying a resist, patterning the resist using lithography, and then etching the one or more material using dry etching, wet etching, or any appropriate technique).

An example fabrication method may include providing a first plateline and a second plateline in a first layer over a support structure and providing a plurality of memory cells (e.g., memory cells 300) in a second layer over the support structure, an individual memory cell comprising a transistor (an access transistor) and a storage capacitor, where the transistor includes a first source/drain (S/D) region, a second S/D region, and a channel material between the first S/D region and the second S/D region, and where the storage capacitor includes a first capacitor electrode (e.g., 404-1), a second capacitor electrode (e.g., 404-2), and an insulator material between the first and second capacitor electrodes, the first capacitor electrode coupled to the first S/D region. The first plateline may be coupled to the second capacitor electrode of a first memory cell (e.g., the memory cell 300-41) of the plurality of memory cells and the second plateline may be coupled to the second capacitor electrode of a second memory cell (e.g., the memory cell 300-42) of the plurality of memory cells. The method may further include providing a bitline in a third layer over the support structure, where the second layer is between the first layer and the third layer, and where the bitline is coupled to each of the second S/D region of the transistor of the first memory cell and the second S/D region of the transistor of the second memory cell.

Although the operations of the example method described above are described once each and in a particular order, the operations may be performed in any suitable order and repeated as desired. For example, one or more operations may be performed in parallel to manufacture multiple access transistors having one front-side and one back-side S/D contacts and/or to manufacture multiple memory arrays with such transistors substantially simultaneously. In another example, the operations may be performed in a different order to reflect the architecture of a particular device component in which one or more access transistors having one front-side and one back-side S/D contacts as described herein are to be included. In yet another example, some operations may be combined into a single operation, and some operations may be subdivided into more operations than what is described for the example method above.

Furthermore, the example method described above may also include operations not specifically mentioned. In one example, such operations may include various cleaning operations as known in the art. For example, in some embodiments, device assemblies may be cleaned prior to and/or after any of the processes of the example method described above, e.g. to remove surface-bound organic and metallic contaminants, as well as subsurface contamination, to promote adhesion, and/or to decrease interdiffusion of materials. In some embodiments, cleaning may be carried out using e.g. a chemical solutions (such as peroxide), and/or with ultraviolet (UV) radiation combined with ozone, and/or oxidizing the surface (e.g., using thermal oxidation) then removing the oxide (e.g. using hydrofluoric acid (HF)). In some embodiments, cleaning may be carried out using chemical clean, plasma clean, and/or applying heat in a controlled environment. In another example, in some embodiments, device assemblies may be planarized/polished before or after each of the processes of the example method described above. Planarization may be performed using either wet or dry planarization processes. In one embodiment, planarization may be performed using chemical mechanical planarization (CMP), which may be understood as a process that utilizes a polishing surface, an abrasive and a slurry to remove the overburden of one or more materials which may cover upper surfaces of the assemblies, e.g., to expose surfaces of underlying materials for subsequent etch.

Example Electronic Devices

Arrangements with one or more access transistors having one front-side and one back-side S/D contacts as disclosed herein may be included in any suitable electronic device. FIGS. 6-9 illustrate various examples of devices and components that may include one or more dense memory arrays utilizing access transistors with back-side contacts as disclosed herein.

Figures 6A, 6B:
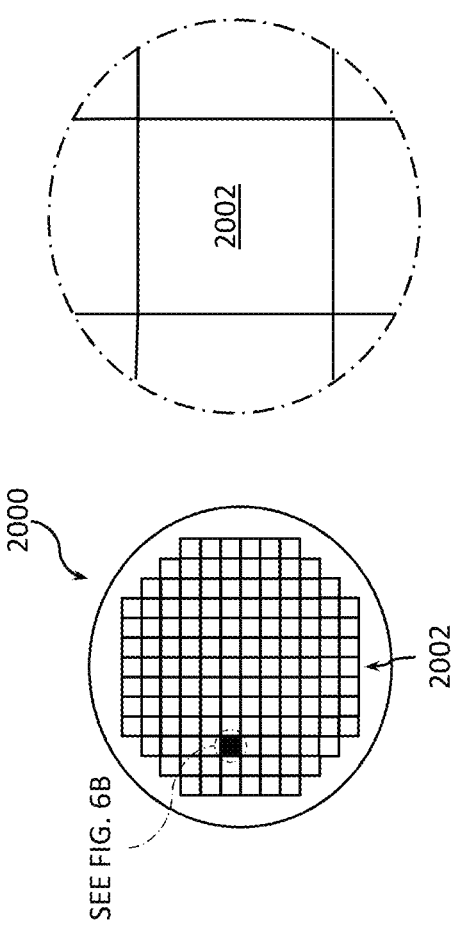
FIGS. 6A and 6B are top views of, respectively, a wafer and dies that may include one or more memory arrays utilizing access transistors with back-side contacts, according to some embodiments of the present disclosure.

FIGS. 6A-6B are top views of a wafer 2000 and dies 2002 that may include one or more dense memory arrays utilizing one or more access transistors with back-side contacts in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 7. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more memory arrays utilizing one or more access transistors with back-side contacts as described herein). After the fabrication of the semiconductor product is complete (e.g., after manufacture of one or more layers of the memory cells utilizing one or more access transistors with back-side contacts as described herein (e.g. any embodiments of the memory cells, arrays, and IC devices shown in FIGS. 1-5), the wafer 2000 may undergo a singulation process in which each of the dies 2002 is separated from one another to provide discrete "chips" of the semiconductor product. In particular, devices that include one or more memory arrays utilizing one or more access transistors with back-side contacts as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a DRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 9) or other logic that is configured to store information in the memory devices or execute instructions stored in the memory array.

Figure 7:
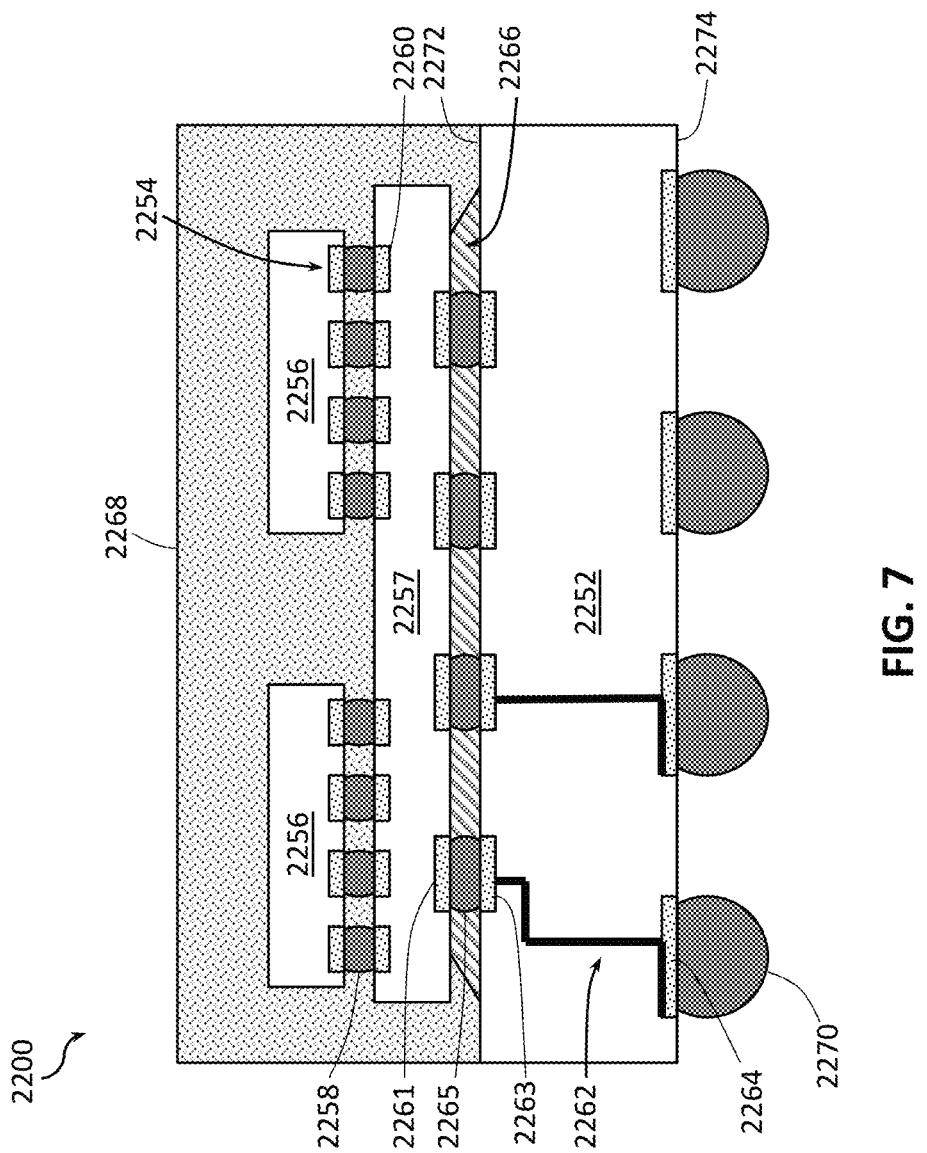
FIG. 7 is a cross-sectional side view of an IC package that may include one or more memory arrays utilizing access transistors with back-side contacts, according to some embodiments of the present disclosure.

FIG. 7 is a side, cross-sectional view of an example IC package 2200 that may include one or more memory arrays utilizing one or more access transistors with back-side contacts in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 7 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 7 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 7 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 8.

The dies 2256 may take the form of any of the embodiments of the die 2002 discussed herein (e.g., may include any of the embodiments of the memory arrays utilizing one or more access transistors with back-side contacts as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include one or more memory arrays utilizing one or more access transistors with back-side contacts, e.g., as discussed above; in some embodiments, at least some of the dies 2256 may not include any access transistors with back-side contacts as described herein.

The IC package 2200 illustrated in FIG. 7 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 7, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 8:
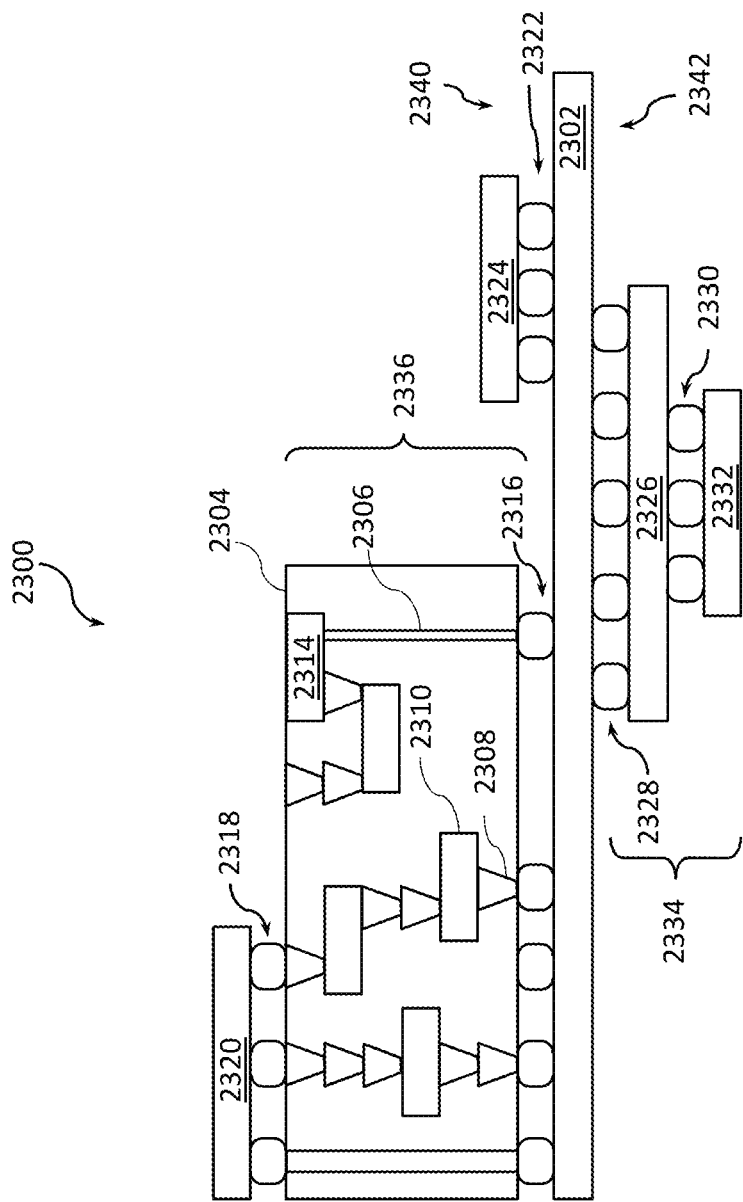
FIG. 8 is a cross-sectional side view of an IC device assembly that may include one or more memory arrays utilizing access transistors with back-side contacts, according to some embodiments of the present disclosure.

FIG. 8 is a cross-sectional side view of an IC device assembly 2300 that may include components having one or more memory arrays utilizing one or more access transistors with back-side contacts in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more memory arrays utilizing one or more access transistors with back-side contacts in accordance with any of the embodiments disclosed herein; e.g., any of the IC packages discussed below with reference to the IC device assembly 2300 may take the form of any of the embodiments of the IC package 2200 discussed above with reference to FIG. 7 (e.g., may include one or more memory arrays utilizing one or more access transistors with back-side contacts provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 8 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 8), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 6B), an IC device, or any other suitable component. In particular, the IC package 2320 may include one or more memory arrays utilizing one or more access transistors with back-side contacts as described herein. Although a single IC package 2320 is shown in FIG. 8, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 8, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 8 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 9:
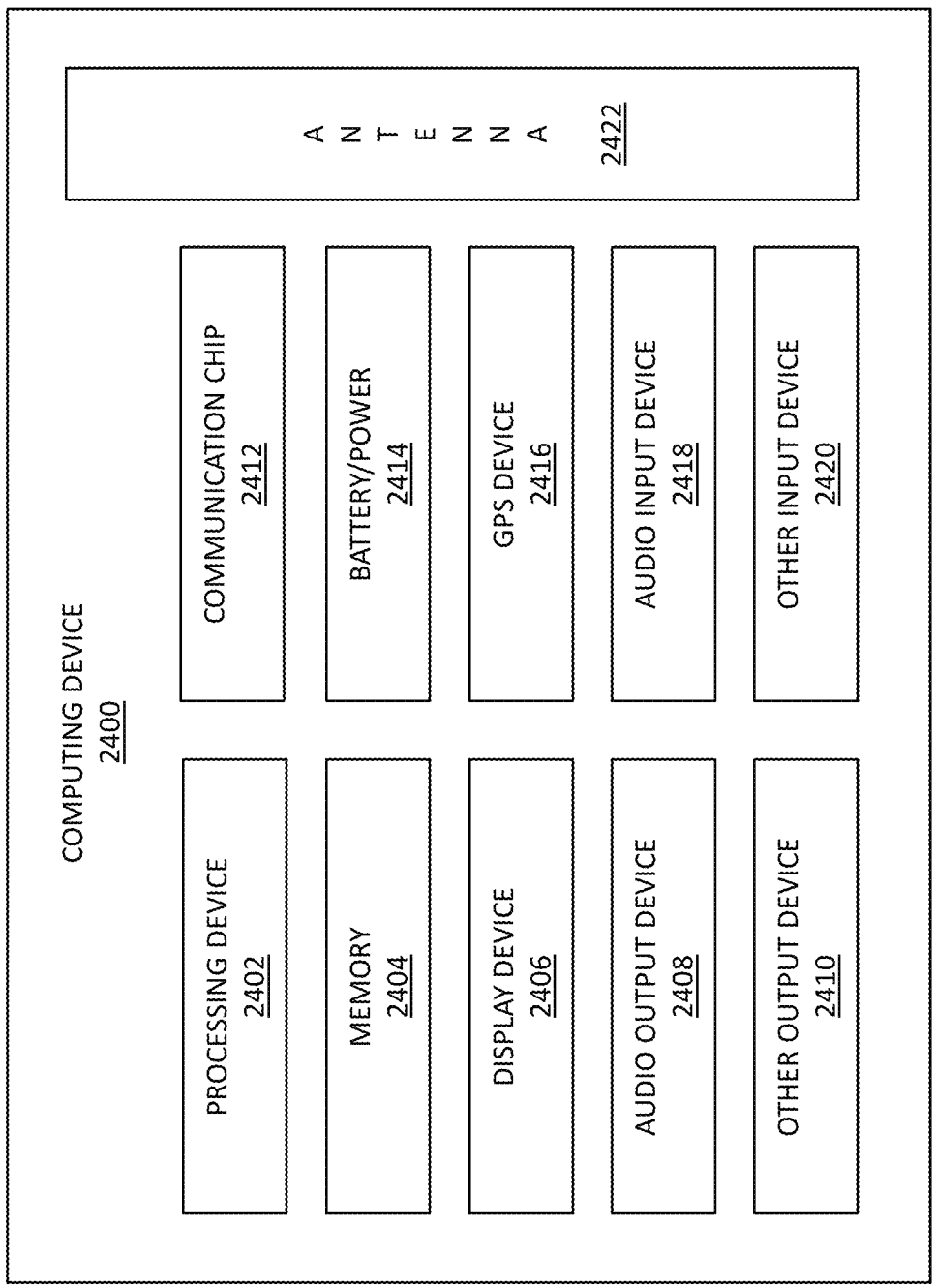
FIG. 9 is a block diagram of an example computing device that may include one or more memory arrays utilizing access transistors with back-side contacts, according to some embodiments of the present disclosure.

FIG. 9 is a block diagram of an example computing device 2400 that may include one or more components with one or more memory arrays utilizing one or more access transistors with back-side contacts in accordance with any of the embodiments disclosed herein. For example, any suitable ones of the components of the computing device 2400 may include a die (e.g., the die 2002 (FIG. 6B)) including one or more memory arrays utilizing one or more access transistors with back-side contacts in accordance with any of the embodiments disclosed herein. Any of the components of the computing device 2400 may include an IC package 2200 (FIG. 7). Any of the components of the computing device 2400 may include an IC device assembly 2300 (FIG. 8).

A number of components are illustrated in FIG. 9 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 9, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include eDRAM, e.g. an array (e.g., a 3D array), of memory cells at least some of which include access transistors with back-side contacts as described herein, and/or spin transfer torque magnetic random-access memory (STT-M RAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides a memory device that includes a support structure (e.g., a substrate); a plurality of memory cells (e.g., memory cells 300) provided over the support structure, an individual memory cell including a transistor (an access transistor) and a storage capacitor, where the transistor includes a first S/D region, a second S/D region, and a channel material between the first S/D region and the second S/D region, and where the storage capacitor includes a first capacitor electrode (e.g., 404-1), a second capacitor electrode (e.g., 404-2), and an insulator material between the first and second capacitor electrodes, the first capacitor electrode coupled to the first S/D region. The memory device further includes a first plateline (e.g., 460-41), coupled to the second capacitor electrode of a first memory cell (e.g., the memory cell 300-41) of the plurality of memory cells; a second plateline (e.g., 460-42), coupled to the second capacitor electrode of a second memory cell (e.g., the memory cell 300-42) of the plurality of memory cells; and a bitline (e.g., 440-4), coupled to each of the second S/D region of the transistor of the first memory cell and the second S/D region of the transistor of the second memory cell, where the first plateline and the second plateline are in a first layer (e.g., 520-1), the channel material is in a second layer (e.g., 520-2), the bitline is in a third layer (e.g., 520-3), and the second layer is between the first layer and the third layer.

Example 2 provides the memory device according to example 1, where the bitline is parallel to the first plateline and a projection of the bitline on a plane parallel to the support structure at least partially overlaps with a projection of the first plateline on the plane.

Example 3 provides the memory device according to example 2, where the projection of the bitline at least partially overlaps with a projection of the second plateline on the plane, and the projection of the first plateline does not overlap with the projection of the second plateline.

Example 4 provides the memory device according to any one of the preceding examples, where the channel material of the second memory cell is electrically continuous with the channel material of the first memory cell (e.g., the first and second memory cells may be provided over a single fin in case the transistors are implemented as FinFETs, or over a single nanowire/nanoribbon in case the transistors are implemented as nanowire/nanoribbon transistors).

Example 5 provides the memory device according to any one of the preceding examples, where the second S/D region of the transistor of the second memory cell and the second S/D region of the transistor of the first memory cell is a single shared S/D region.

Example 6 provides the memory device according to any one of the preceding examples, where the bitline is further coupled to the second S/D region of the transistor of a third memory cell (e.g., the memory cell 300-43) of the plurality of memory cells.

Example 7 provides the memory device according to example 6, where the channel material of the second memory cell is electrically discontinuous with the channel material of the third memory cell (e.g., the second and third memory cells may be provided over a single fin or over a single nanowire/nanoribbon but the fin or nanowire/nanoribbon may be disrupted in between these two memory cells).

Example 8 provides the memory device according to any one of the preceding examples, where the individual memory cell further includes a gate (e.g., a gate stack 108) provided over a portion of the channel material between the first S/D region and the second S/D region of the transistor, the memory device further includes a wordline (e.g., 450-1), coupled to the gate of the first memory cell, the memory device further includes a further memory cell (e.g., the memory cell 300-31), and the wordline is further coupled to the gate of the further memory cell.

Example 9 provides the memory device according to example 8, where 1) the transistor of the individual memory cell is a FinFET, and the channel materials of the first and second memory cells are different portions of a first fin, while the channel material of the further memory cell is a portion of a second fin, different from the first fin, or 2) the transistor of the individual memory cell is a nanowire transistor, and the channel materials of the first and second memory cells are different portions of a first nanowire, while the channel material of the further memory cell is a portion of a second nanowire, different from the first nanowire, or 3) the transistor of the individual memory cell is a nanoribbon transistor, and the channel materials of the first and second memory cells are different portions of a first nanoribbon, while the channel material of the further memory cell is a portion of a second nanoribbon, different from the first nanoribbon.

Example 10 provides the memory device according to example 9, further including a SAGE isolation structure between the first memory cell and the further memory cell. When the transistor of the individual memory cell is the FinFET, the SAGE isolation structure extends between the first fin and the second fin and is parallel to the first fin and the second fin. When the transistor of the individual memory cell is the nanowire transistor, the SAGE isolation structure extends between the first nanowire and the second nanowire and is parallel to the first nanowire and the second nanowire. When the transistor of the individual memory cell is the nanoribbon transistor, the SAGE isolation structure extends between the first nanoribbon and the second nanoribbon and is parallel to the first nanoribbon and the second nanoribbon.

Example 11 provides the memory device according to example 10, where the SAGE isolation structure includes one or more electrically insulating materials.

Example 12 provides the memory device according to any one of the preceding examples, where, when the transistor of the individual memory cell is the FinFET, a pitch between the first fin and the second fin is between about 10% and 500% of a width of the first or second fin; when the transistor of the individual memory cell is the nanowire transistor, a pitch between the first nanowire and the second nanowire is between about 10% and 500% of a width of the first or second nanowire; and when the transistor of the individual memory cell is the nanoribbon transistor, a pitch between the first nanoribbon and the second nanoribbon is between about 10% and 500% of a width of the first or second nanoribbon.

Example 13 provides the memory device according to any one of the preceding examples, where the capacitor is in a fourth layer, and the fourth layer is between the second layer and the first layer.

Example 14 provides the memory device according to any one of the preceding examples, where the capacitor is a three-dimensional capacitor.

Example 15 provides an IC package that includes an IC die and a further component, coupled to the IC die. The IC die includes a first plateline and a second plateline in a first layer, and a plurality of memory cells (e.g., memory cells 300) in a second layer, an individual memory cell including a transistor (an access transistor) and a storage capacitor, where the transistor includes a first S/D region, a second S/D region, and a channel material between the first S/D region and the second S/D region, and where the storage capacitor includes a first capacitor electrode (e.g., 404-1) and a second capacitor electrode (e.g., 404-2), the first capacitor electrode coupled to the first S/D region. The IC die further includes a bitline in a third layer, where the second layer is between the first layer and the third layer, the first plateline is coupled to the second capacitor electrode of a first memory cell (e.g., the memory cell 300-41) of the plurality of memory cells, the second plateline is coupled to the second capacitor electrode of a second memory cell (e.g., the memory cell 300-42) of the plurality of memory cells, and the bitline is coupled to each of the second S/D region of the transistor of the first memory cell and the second S/D region of the transistor of the second memory cell.

Example 16 provides the IC package according to example 15, where a projection of the bitline on a plane parallel to the IC die at least partially overlaps with a projection of the first plateline on the plane and/or a projection of the second plateline on the plane.

Example 17 provides the IC package according to examples 15 or 16, where the further component is one of a package substrate, a flexible substrate, or an interposer.

Example 18 provides the IC package according to any one of examples 15-17, where the further component is coupled to the IC die via one or more solder bumps, solder posts, or bond wires.

Example 19 provides a method of manufacturing an IC device, the method including providing a first plateline and a second plateline in a first layer over a support structure, and providing a plurality of memory cells (e.g., memory cells 300) in a second layer over the support structure, an individual memory cell including a transistor (an access transistor) and a storage capacitor, where the transistor includes a first S/D region, a second S/D region, and a channel material between the first S/D region and the second S/D region, and where the storage capacitor includes a first capacitor electrode (e.g., 404-1), a second capacitor electrode (e.g., 404-2), and an insulator material between the first and second capacitor electrodes, the first capacitor electrode coupled to the first S/D region, where the first plateline is coupled to the second capacitor electrode of a first memory cell (e.g., the memory cell 300-41) of the plurality of memory cells and the second plateline is coupled to the second capacitor electrode of a second memory cell (e.g., the memory cell 300-42) of the plurality of memory cells. The method further includes providing a bitline in a third layer over the support structure, where the second layer is between the first layer and the third layer, and where the bitline is coupled to each of the second S/D region of the transistor of the first memory cell and the second S/D region of the transistor of the second memory cell.

Example 21 provides a computing device that includes a circuit board; and an IC die coupled to the circuit board, where the IC die includes one or more of the memory devices according to any one of the preceding examples (e.g., memory devices according to any one of examples 1-14), and/or the IC die is included in the IC package according to any one of the preceding examples (e.g., the IC package according to any one of examples 15-18).

Example 22 provides the computing device according to example 21, where the computing device is a wearable computing device (e.g., a smart watch) or handheld computing device (e.g., a mobile phone).

Example 23 provides the computing device according to examples 21 or 22, where the computing device is a server processor.

Example 24 provides the computing device according to examples 21 or 22, where the computing device is a motherboard.

Example 25 provides the computing device according to any one of examples 21-24, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A memory device, comprising:
   a plurality of memory cells, an individual memory cell comprising a transistor and a capacitor, where the transistor includes a first source/drain (S/D) region, a second S/D region, and a channel material between the first S/D region and the second S/D region, and where the capacitor includes a first capacitor electrode and a second capacitor electrode, the first capacitor electrode coupled to the first S/D region;
   a first plateline, coupled to the second capacitor electrode of a first memory cell of the plurality of memory cells;
   a second plateline, coupled to the second capacitor electrode of a second memory cell of the plurality of memory cells; and
   a bitline, coupled to each of the second S/D region of the transistor of the first memory cell and the second S/D region of the transistor of the second memory cell,
   where the first plateline and the second plateline are in a first layer, the channel material is in a second layer, the bitline is in a third layer, and the second layer is between the first layer and the third layer.

2. The memory device according to claim 1, wherein the transistor is over a support structure, the bitline is parallel to the first plateline, and a projection of the bitline on a plane parallel to the support structure at least partially overlaps with a projection of the first plateline on the plane.

3. The memory device according to claim 2, wherein the projection of the bitline at least partially overlaps with a projection of the second plateline on the plane, and the projection of the first plateline does not overlap with the projection of the second plateline.

4. The memory device according to claim 1, wherein the channel material of the second memory cell is electrically continuous with the channel material of the first memory cell.

5. The memory device according to claim 1, wherein the second S/D region of the transistor of the second memory cell and the second S/D region of the transistor of the first memory cell is a shared S/D region.

6. The memory device according to claim 1, wherein the bitline is further coupled to the second S/D region of the transistor of a third memory cell of the plurality of memory cells.

7. The memory device according to claim 6, wherein the channel material of the second memory cell is electrically discontinuous with the channel material of the third memory cell.

8. The memory device according to claim 1, wherein:
the individual memory cell further includes a gate over a portion of the channel material between the first S/D region and the second S/D region of the transistor,
the memory device further includes a wordline, coupled to the gate of the first memory cell,
the memory device further includes a further memory cell, and
the wordline is further coupled to the gate of the further memory cell.

9. The memory device according to claim 8, wherein:
the transistor of the individual memory cell is a FinFET, and the channel materials of the first and second memory cells are different portions of a first fin, while the channel material of the further memory cell is a portion of a second fin, different from the first fin, or
the transistor of the individual memory cell is a nanowire transistor, and the channel materials of the first and second memory cells are different portions of a first nanowire, while the channel material of the further memory cell is a portion of a second nanowire, different from the first nanowire, or
the transistor of the individual memory cell is a nanoribbon transistor, and the channel materials of the first and second memory cells are different portions of a first nanoribbon, while the channel material of the further memory cell is a portion of a second nanoribbon, different from the first nanoribbon.

10. The memory device according to claim 9, further comprising a self-aligned gate edge (SAGE) isolation structure between the first memory cell and the further memory cell, wherein:
when the transistor of the individual memory cell is the FinFET, the SAGE isolation structure extends between the first fin and the second fin,
when the transistor of the individual memory cell is the nanowire transistor, the SAGE isolation structure extends between the first nanowire and the second nanowire, and
when the transistor of the individual memory cell is the nanoribbon transistor, the SAGE isolation structure extends between the first nanoribbon and the second nanoribbon.

11. The memory device according to claim 10, wherein the SAGE isolation structure includes one or more electrically insulating materials.

12. The memory device according to claim 1, wherein:
when the transistor of the individual memory cell is the FinFET, a pitch between the first fin and the second fin is between 10% and 500% of a width of the first or second fin,
when the transistor of the individual memory cell is the nanowire transistor, a pitch between the first nanowire and the second nanowire is between 10% and 500% of a width of the first or second nanowire, and
when the transistor of the individual memory cell is the nanoribbon transistor, a pitch between the first nanoribbon and the second nanoribbon is between 10% and 500% of a width of the first or second nanoribbon.

13. The memory device according to claim 1, wherein:
the capacitor is in a fourth layer, and
the fourth layer is between the second layer and the first layer.

14. The memory device according to claim 1, wherein the capacitor is a three-dimensional capacitor.

15. An integrated circuit (IC) package, the IC package comprising:
an IC die; and
a further component, coupled to the IC die,
where the IC die includes:
a first plateline and a second plateline in a first layer,
a plurality of memory cells in a second layer, an individual memory cell comprising a transistor and a capacitor, where the transistor includes a first source/drain (S/D) region, a second S/D region, and a channel material between the first S/D region and the second S/D region, and where the capacitor includes a first capacitor electrode and a second capacitor electrode, the first capacitor electrode coupled to the first S/D region, and
a bitline in a third layer, where the second layer is between the first layer and the third layer,
where the first plateline is coupled to the second capacitor electrode of a first memory cell of the plurality of memory cells, the second plateline is coupled to the second capacitor electrode of a second memory cell of the plurality of memory cells, and the bitline is coupled to each of the second S/D region of the transistor of the first memory cell and the second S/D region of the transistor of the second memory cell.

16. The IC package according to claim 15, wherein a projection of the bitline on a plane parallel to the IC die at least partially overlaps with a projection of the first plateline on the plane or a projection of the second plateline on the plane.

17. The IC package according to claim 15, wherein the further component is one of a package substrate, a flexible substrate, or an interposer.

18. The IC package according to claim 15, wherein the further component is coupled to the IC die via one or more solder bumps, solder posts, or bond wires.

* * * * *